(12) United States Patent
Paul et al.

(10) Patent No.: US 8,704,302 B2
(45) Date of Patent: Apr. 22, 2014

(54) POWER SEMICONDUCTOR DEVICES AND METHODS

(71) Applicant: MaxPower Semiconductor, Inc., Santa Clara, CA (US)

(72) Inventors: Amit Paul, Sunnyvale, CA (US); Mohamed N. Darwish, Campbell, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 13/670,019

(22) Filed: Nov. 6, 2012

(65) Prior Publication Data

US 2013/0299899 A1    Nov. 14, 2013

Related U.S. Application Data

(63) Continuation of application No. 12/790,734, filed on May 28, 2010, now Pat. No. 8,330,214.

(60) Provisional application No. 61/181,919, filed on May 28, 2009.

(51) Int. Cl.
  *H01L 29/66*    (2006.01)
(52) U.S. Cl.
  USPC .................................... 257/339; 257/E29.201
(58) Field of Classification Search
  USPC .......................................... 257/339, E29.201
  See application file for complete search history.

(56) References Cited

U.S. PATENT DOCUMENTS

| | | | | |
|---|---|---|---|---|
| 4,914,058 | A * | 4/1990 | Blanchard | 438/270 |
| 5,665,996 | A * | 9/1997 | Williams et al. | 257/401 |
| 5,864,159 | A * | 1/1999 | Takahashi | 257/330 |
| 5,981,996 | A * | 11/1999 | Fujishima | 257/335 |
| 6,509,233 | B2 * | 1/2003 | Chang et al. | 438/270 |
| 6,605,858 | B2 * | 8/2003 | Hattori | 257/565 |
| 6,610,572 | B1 * | 8/2003 | Takei et al. | 438/268 |
| 6,762,097 | B2 * | 7/2004 | Takei et al. | 438/268 |
| 7,345,339 | B2 * | 3/2008 | Yamaguchi et al. | 257/332 |
| 2002/0123196 | A1 * | 9/2002 | Chang et al. | 438/270 |
| 2004/0016963 | A1 * | 1/2004 | Baliga | 257/330 |
| 2004/0171198 | A1 * | 9/2004 | Zeng | 438/142 |
| 2006/0138407 | A1 * | 6/2006 | Yamaguchi et al. | 257/40 |

* cited by examiner

*Primary Examiner* — Lex Malsawma
(74) *Attorney, Agent, or Firm* — Robert O. Groover, III; Gwendolyn S. S. Groover; Groover & Associates PLLC

(57) ABSTRACT

The present inventors have realized that manufacturability plays into optimization of power semiconductor devices in some surprising new ways. If the process window is too narrow, the maximum breakdown voltage will not be achieved due to doping variations and the like normally seen in device fabrication. Thus, among other teachings, the present application describes some ways to improve the process margin, for a given breakdown voltage specification, by actually reducing the maximum breakdown voltage. In one class of embodiments, this is done by introducing a vertical gradation in the density of fixed electrostatic charge, or in the background doping of the drift region, or both. Several techniques are disclosed for achieving this.

8 Claims, 22 Drawing Sheets

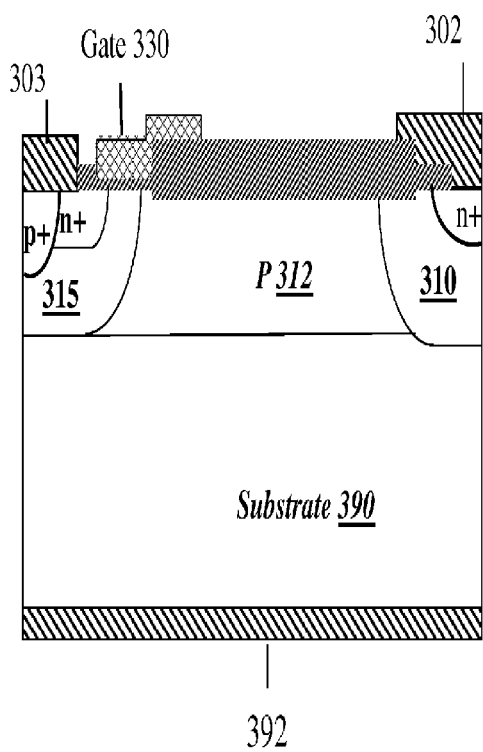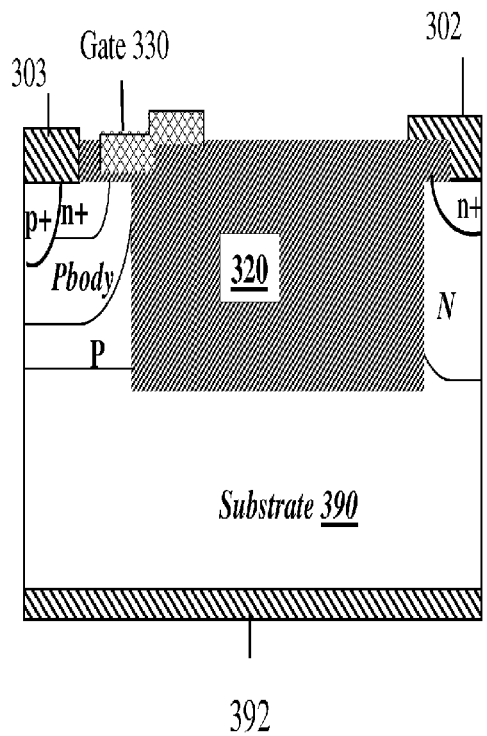
Figure 3(b) Figure 3(c)

Breakdown voltage sensitivity to pillar width

POWER SEMICONDUCTOR DEVICES AND METHODS

CROSS-REFERENCE

Priority is claimed from U.S. patent application 61/181,919 filed May 28, 2009, which is hereby incorporated by reference.

BACKGROUND

The present application relates to semiconductor devices, and particularly to power semiconductor devices which use intentionally introduced electrostatic charge in trenches which adjoin regions where current flows in the ON state.

Note that the points discussed below may reflect the hindsight gained from the disclosed inventions, and are not necessarily admitted to be prior art.

Power MOSFETs are widely used as switching devices in many electronic applications. In order to minimize the conduction power loss it is desirable that power MOSFETs have a low specific on-resistance ($R_{SP}$ or $R^*A$), which is defined as the product of the on-resistance of the MOSFET multiplied by the active die area. In general, the on-resistance of a power MOSFET is dominated by the channel resistance and the drift region resistances which include the substrate resistance, spreading resistance and the epitaxial (epi) layer resistance.

Recently, the so called super-junction structure has been developed to reduce the drift region resistance. The super-junction structure consists of alternating highly doped p-type and n-type pillars or layers. For a given breakdown voltage, the doping concentrations of n-type pillar (the n-type drift region) can be one order of magnitude higher than that of conventional drift region provided that the total charge of n-type pillar is designed to be balanced with charge in the p-type pillar. In order to fully realize the benefits of the super-junction, it is desirable to increase the packing density of the pillars to achieve a lower $R_{SP}$. However, the minimum pillar widths that can be attained in practical device manufacturing set a limitation on the reducing the cell pitch and scaling the device.

Recently, an invention (US application 20080164518), as shown in FIG. 1, has been disclosed to address this issue by incorporating fixed or permanent positive charge ($Q_F$) to balance the charge of p-type pillar. The permanent charge can also form an electron drift region in a power MOSFET by forming an inversion layer along the interface between the oxide and P Epi layer. By making use of this new concept, the area scaling limitation due to inter-diffusion of p-type pillar and n-type pillar can be eliminated. Consequently, a small cell pitch and high packing density of pillars as well the channel can be realize to reduce the device total on-resistance (and specific on-resistance $R_{SP}$). In addition, the structure of FIG. 1 has a key advantage over conventional super-junction devices in that there is no JFET effect to limit the current so smaller cell pitches are highly desirable. Other embodiments of the same concept are shown in FIG. 2 where a planar gate is used and in FIGS. 3(a), (b) and (c) where a lateral device is shown.

One problem with super-junction devices generally, and specifically with the prior art devices shown in FIGS. 1-3(c), is the sensitivity to charge imbalance. If the total charge in an n-type pillar differs from the total charge in a p-type pillar, the maximum breakdown voltage achievable is reduced. For the device shown in FIG. 1, this imbalance is between the p-type pillar charge and the permanent charge ($Q_F$) in the dielectric material filling the trench.

In the MOSFET structures shown in FIGS. 1-3(c), the breakdown voltage is proportional to the trench depth, and the specific on-resistance $R_{SP}$ is proportional to the cell pitch. A small cell pitch or high aspect ratio of the trench (depth/width ratio) are desired to reduce the device total on-resistance and specific on-resistance $R_{SP}$. As shown in FIG. 4, the minimum Cesium implant tilt angle $\phi$ that can be used determines the trench's highest possible aspect ratio (depth over width). As the trench depth increases and cell pitch reduces, the implant tilt angle $\phi$ becomes very small, which creates manufacturing problems. For example, for a trench with an aspect ratio of 15, an implant tilt angle $\phi$ of only about 3.8 degrees will be required. (An implant directly normal to the surface would be referred to as a zero tilt angle; typically the wafer is rotated during implantation, so that the effective implant angle is the same for any direction within the surface plane of the wafer.)

One way to improve the process window or the sensitivity of the breakdown voltage to charge imbalance for both conventional super-junction devices is to increase the width of the pillars or mesas of the prior art devices shown in FIGS. 1-3(c). FIG. 5 shows results from two-dimensional device simulations of the structure shown in FIG. 1 where the mesa width and trench widths are increased from 4 µm to 6 µm, resulting in devices with cell pitch of 8 µm and 12 µm respectively. For the target breakdown voltage of 600V, the process window is clearly improved by using the larger cell pitch of 12 µm compared to 8 µm. However, a clear disadvantage of increasing the cell pitch further is the reduction of specific-on resistance.

It is therefore desirable to reduce specific on-resistance $R_{SP}$ AND meet the required breakdown voltage with adequately large process window. To reduce specific on-resistance $R_{SP}$ a high aspect ratio of the trench is required. It is also necessary to balance the lowest $R_{SP}$ achievable against the manufacturability of the device.

SUMMARY

The present inventors have realized that manufacturability plays into device optimization in some surprising new ways. If the process window is too narrow, the maximum breakdown voltage will not be achieved due to doping variations and the like normally seen in device fabrication. Thus, among other teachings, the present application describes some ways to improve the process margin, for a given breakdown voltage specification, by actually reducing the maximum breakdown voltage.

In one class of embodiments, this is done by introducing a gradation in the density of fixed electrostatic charge along the trench side walls, or in the background doping of the drift region, or both. Several techniques are disclosed for achieving this.

The disclosed innovations, in various embodiments, provide one or more of at least the following advantages. However, not all of these advantages result from every one of the innovations disclosed, and this list of advantages does not limit the various claimed inventions.

Improved specific on-resistance ($R_{SP}$),
Improved manufacturability;
Improved breakdown voltage; and
Improved quality control.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 3(a), 3(b) and 3(c) show a lateral device which is somewhat similar to the vertical device of FIG. 1.

FIGS. 10(c) and 10(b) show examples of doping profiles with additional p-type doping near the bottom of the epitaxial layer.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

As discussed above, FIG. 1 schematically shows a device previously proposed by ones of the present inventors, in which a fixed or permanent positive charge sheet $Q_F$ is used to balance the depletion charge of p-type pillar. The present application discloses some very significant improvements to devices like those of FIGS. 1, 2, and 3(a)-3(b), in accordance with the description below and the illustrations in FIGS. 7-13.

Figure 1:
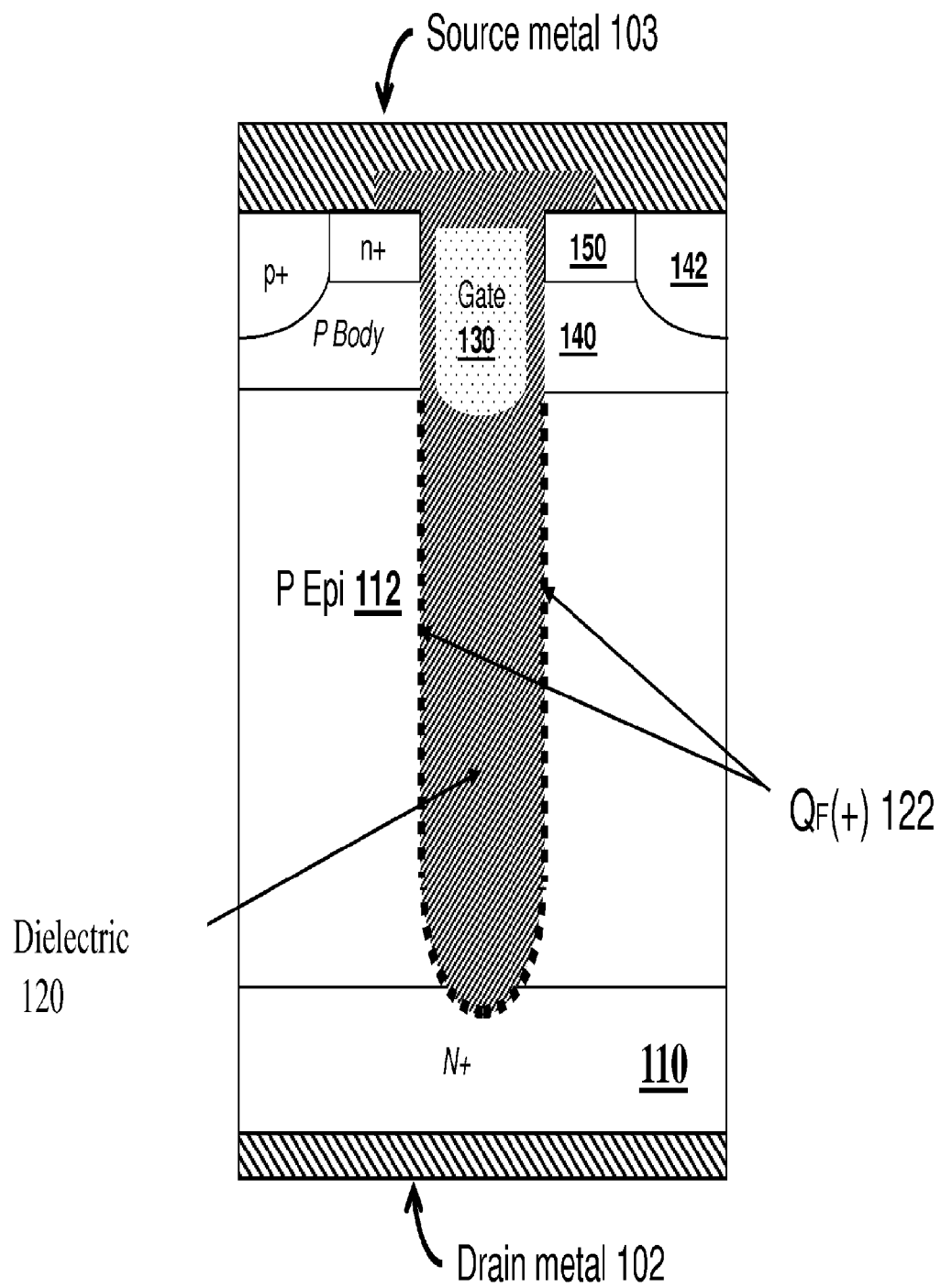
FIG. 1 schematically shows a device previously proposed by ones of the present inventors, in which a fixed or permanent positive charge sheet ($Q_F$) is used to balance the charge of p-type pillar.

In the structure of FIG. 1 as improved, an insulated gate 130, inside a trench which is otherwise filled with dielectric 120, can invert nearby portions of a p-type body region 140, to thereby form a channel region where excess electrons are present. Under these conditions electrons can flow from source 150, through the channel portion of p-type body region 140 and drift region 112 (which in this example is simply a portion of the p-type epitaxial layer 112), to the drain 110. Source metallization 103 makes ohmic contact to source diffusion 150 and to p+ body contact region 142, and drain metallization 102 makes contact to the drain 110. Thus the source, gate, and body in combination form a current-controlling structure, which (depending on the gate voltage) may or may not allow injection of majority carriers into the drift region. In this example, where the source is n-type, the majority carriers are electrons.

The trench dielectric 120 preferably contains fixed net electrostatic charge 122. In this example, this charge can be provided by cesium ions, which (as described below) are preferably implanted into a grown oxide layer before the trench is partially or completely filled with dielectric 120. In the OFF state, a depletion region will spread from the pn junction between drift region 112 and drain 110. The dopant atoms which are present in the semiconductor material have a net charge under these conditions: for example, a phosphorus (donor) atom which occupies a lattice site in a monocrystalline silicon wafer will have a positive net charge under depletion, and conversely a boron (acceptor) atom will have a negative net charge. This net charge is referred to as "space charge." As discussed above, the spatially fixed net charge 122 helps to balance this space charge when the drift region is depleted (in the OFF state).

In the present application, structures with high manufacturability are disclosed to reduce the sensitivity to charge imbalance while maintaining a high breakdown voltage. The device structures needed to implement this invention can have physical contours very similar to that shown in FIG. 1, except that specially tailored distributions of doping and/or permanent charge are used. Furthermore, different device structures using trenches with aspect ratios greater than 10 and methods of fabricating them that overcome the problems of prior art devices of shallow implant tilt angle are disclosed.

Figure 2:
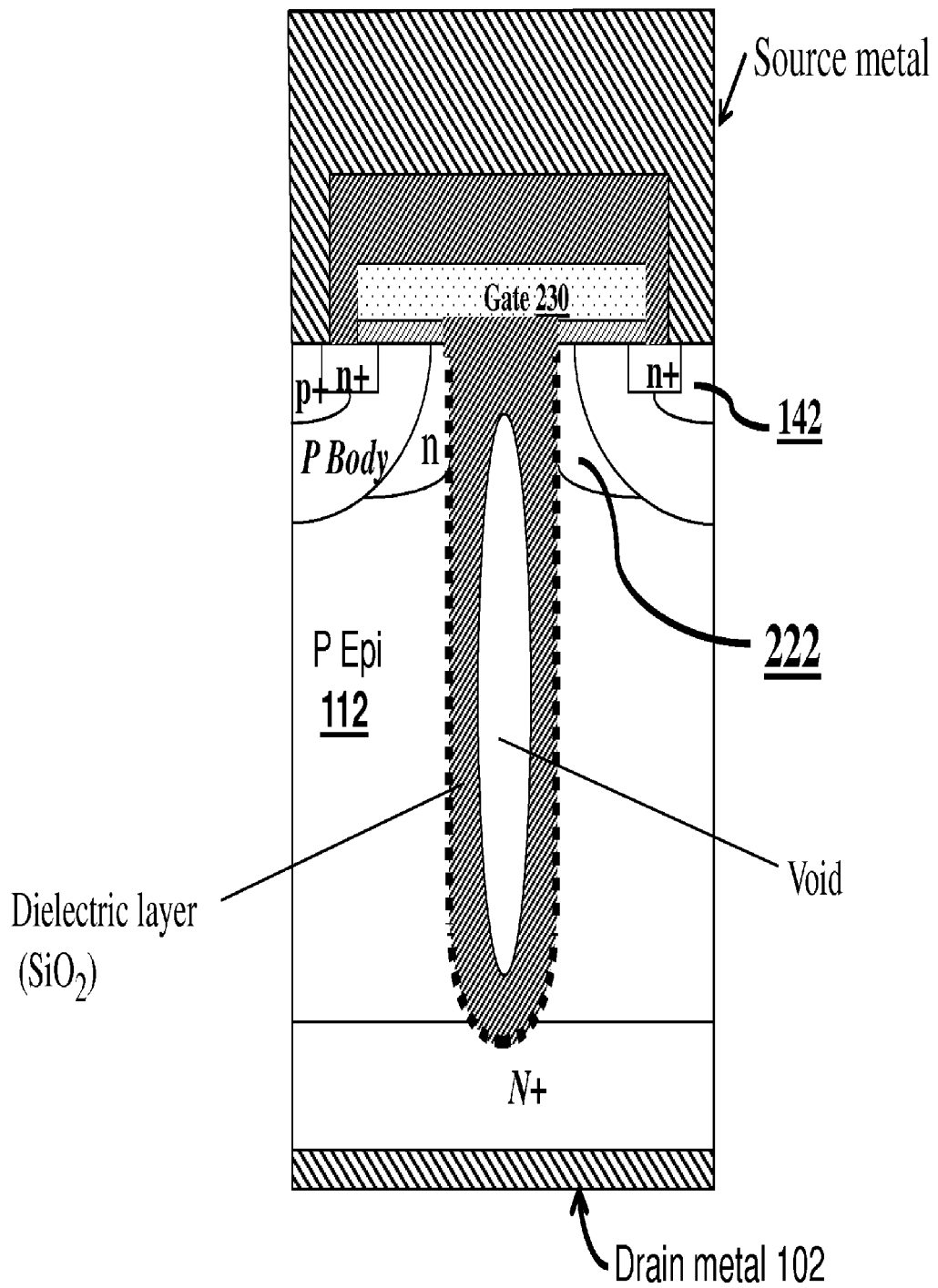
FIG. 2 shows a device which is somewhat similar to that of FIG. 1, but with a planar gate.

FIG. 2 shows a "quasi-vertical" transistor structure, which is somewhat similar to FIG. 1 except that the current-controlling structure includes a planar gate 230, so that the channel is predominantly not vertical. An n-type bridge diffusion 222 connects the channel (when the channel is ON) to the drift region 112. By implementing the fixed net charge $Q_F$ 122 according to any of FIGS. 7-13, the manufactured device more reliably meets specifications, as described below.

Figure 3A:
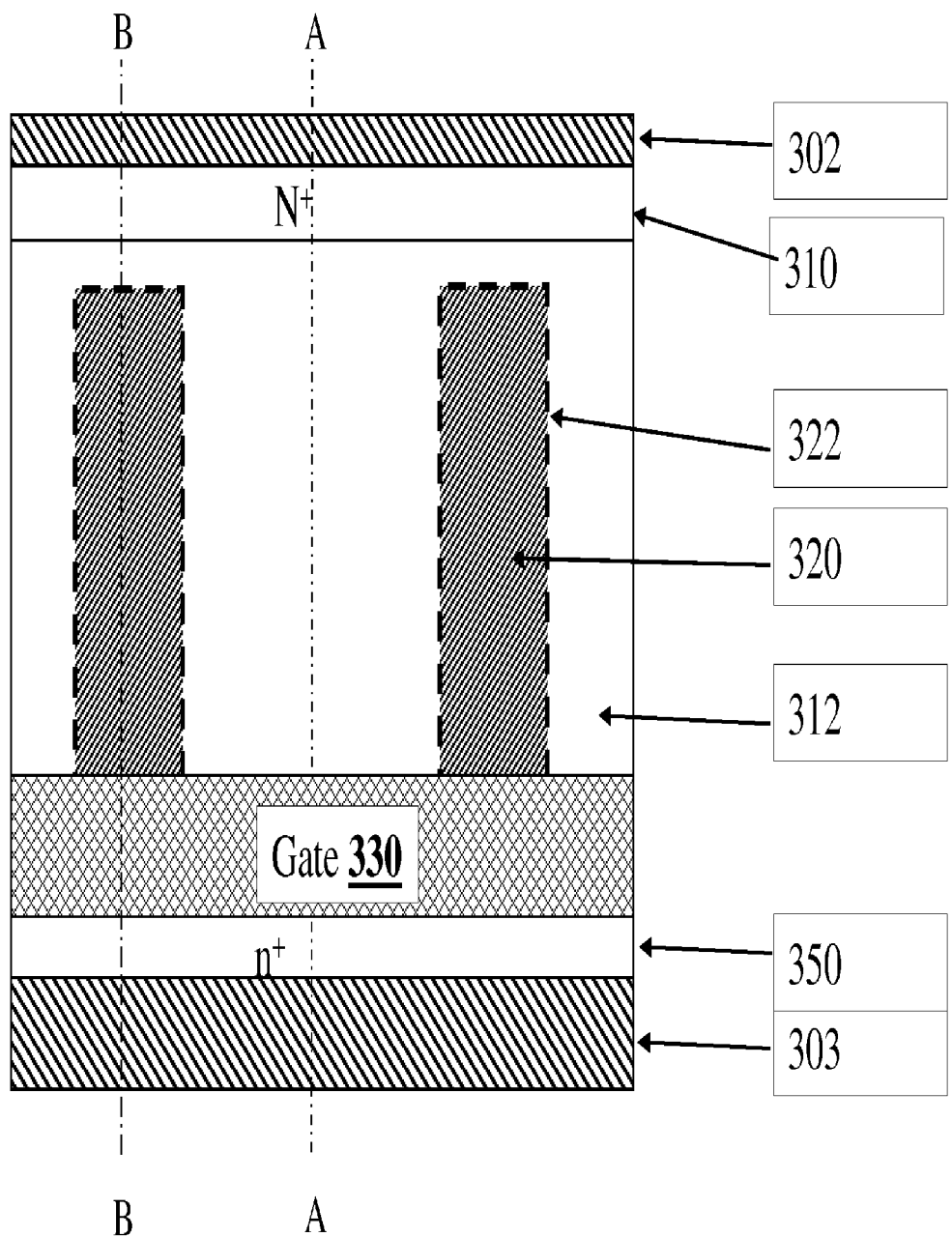
Figure 4:
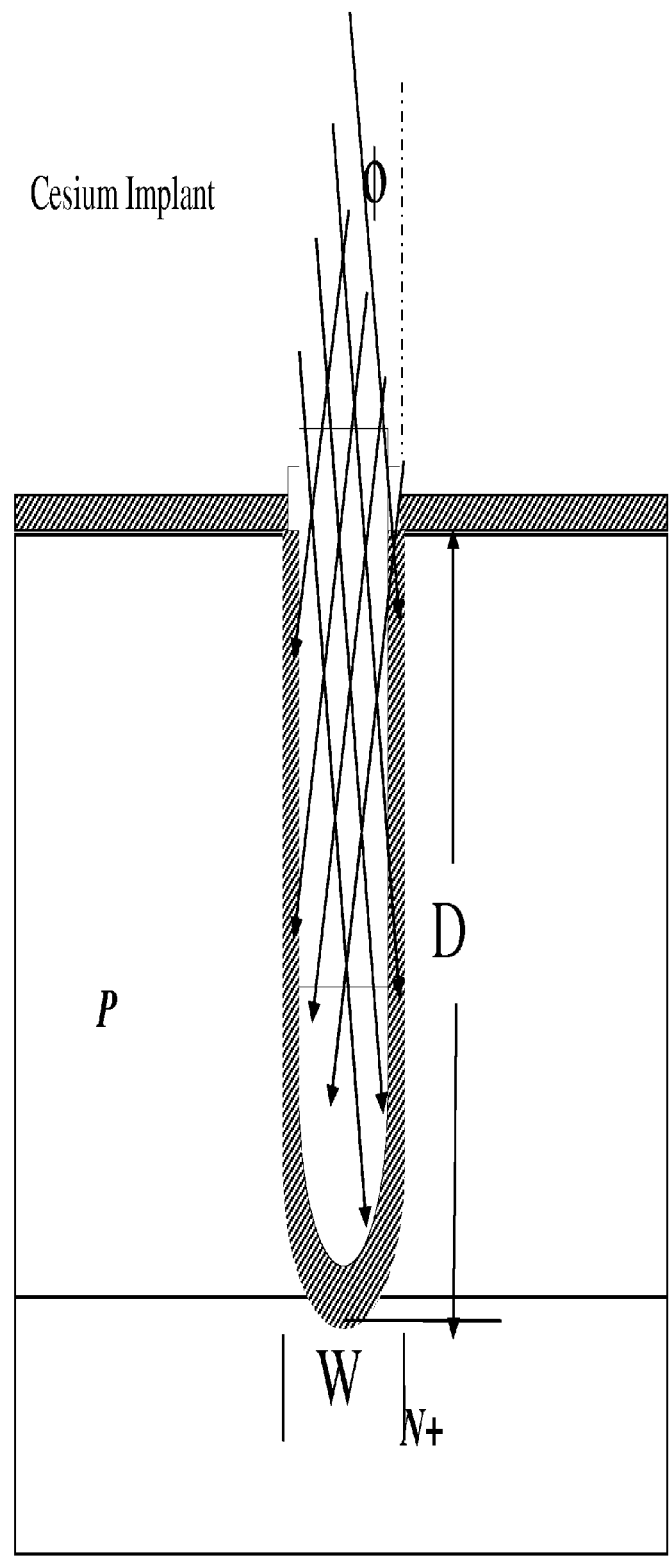
FIG. 4 schematically indicates the geometric relation between the implant tilt angle and the trench aspect ratio.
Figure 5:
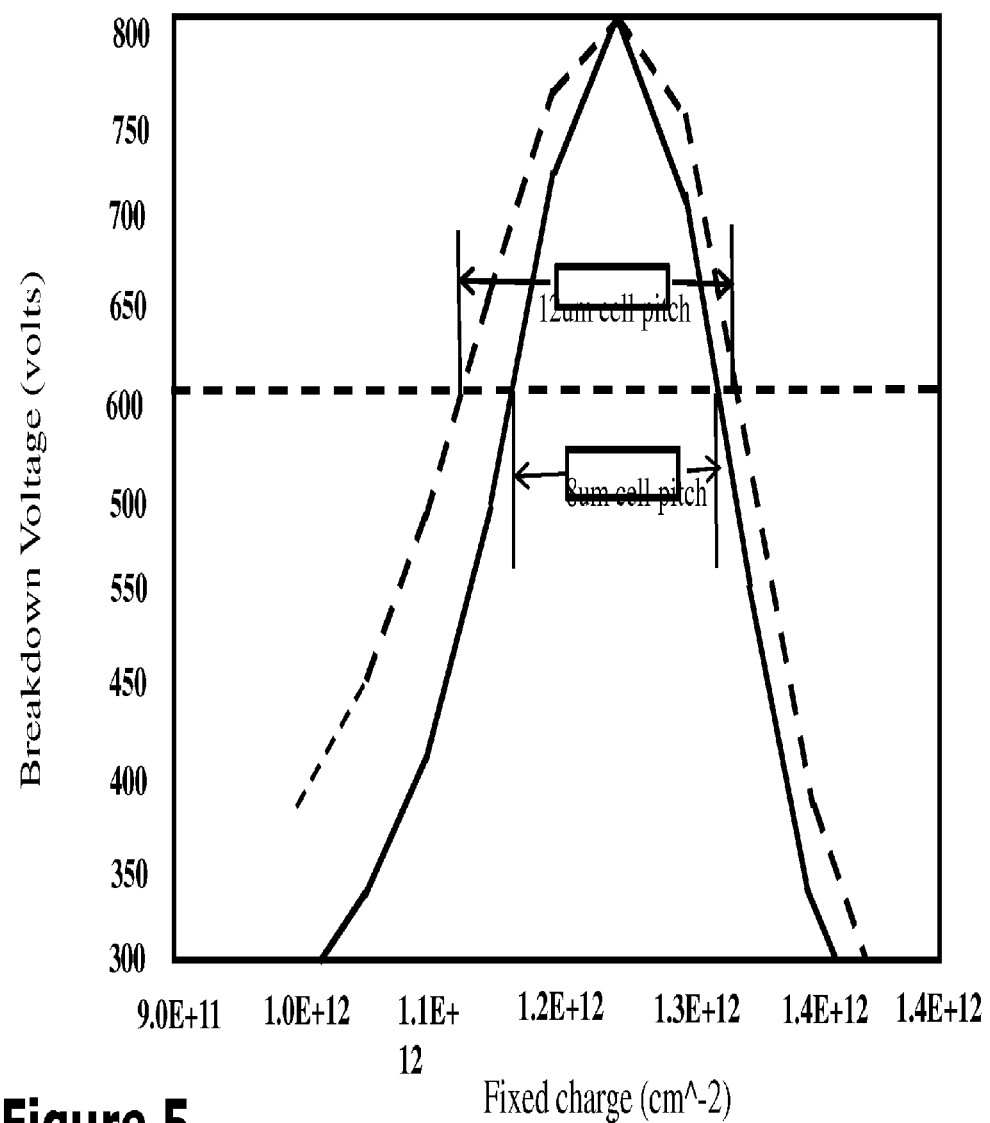
FIG. 5 shows results from two-dimensional device simulations of the structure shown in FIG. 1, with different cell pitches.
Figure 6A:
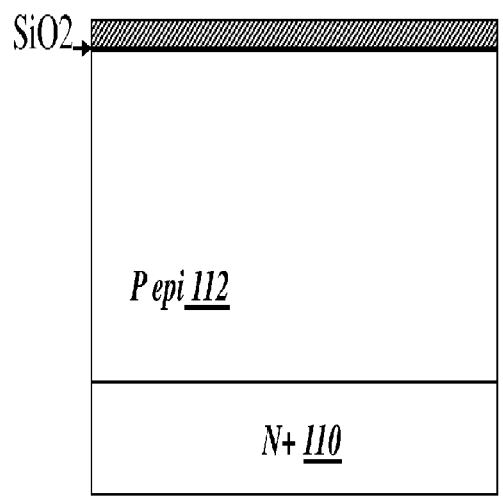
FIGS. 6(a)-6(h) show one example of a fabrication process used to build a device structure like shown in FIG. 1, which can optionally include the innovative features described herein.
Figure 6B:
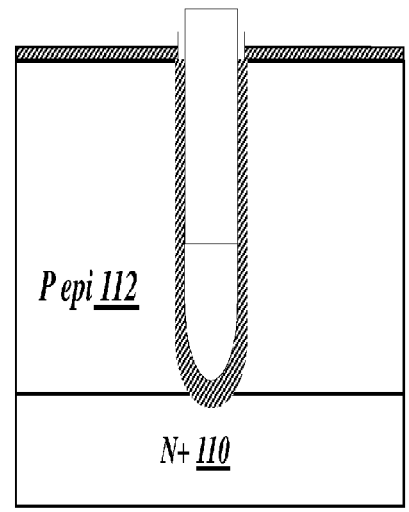
Figure 6C:
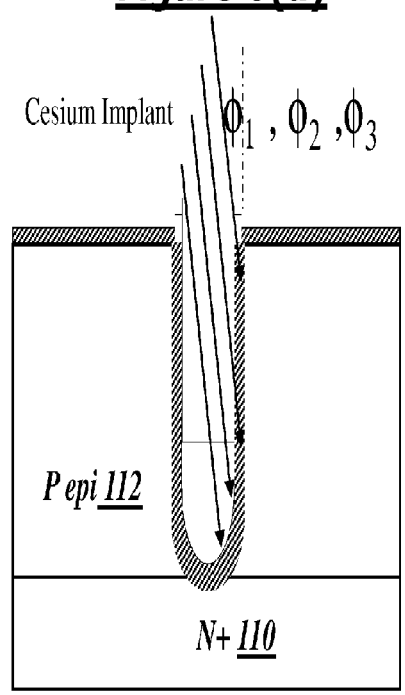
Figure 6D:
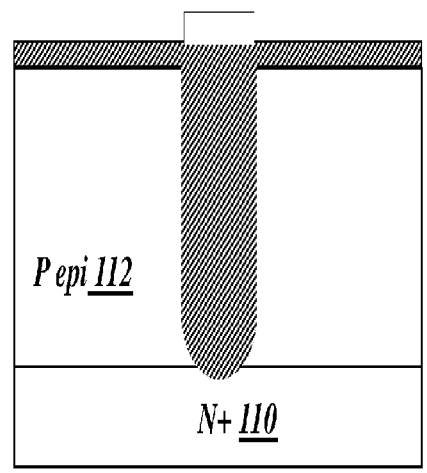
Figure 6E:
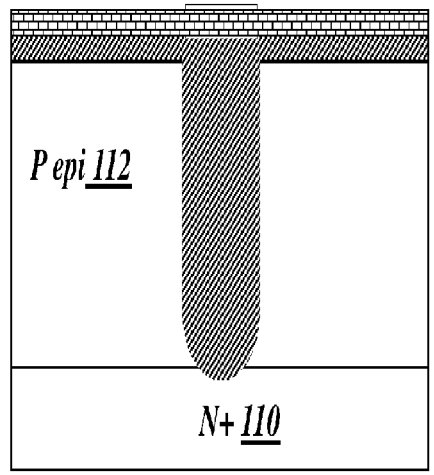
Figure 6F:
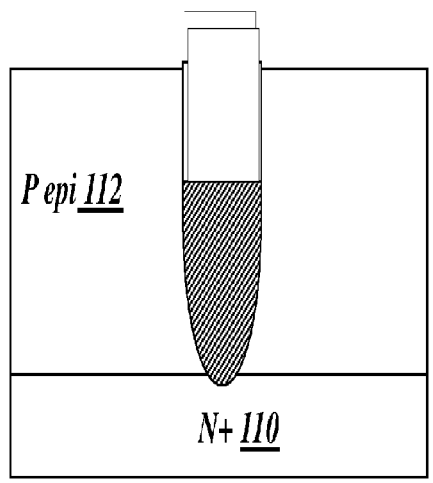
Figure 6G:
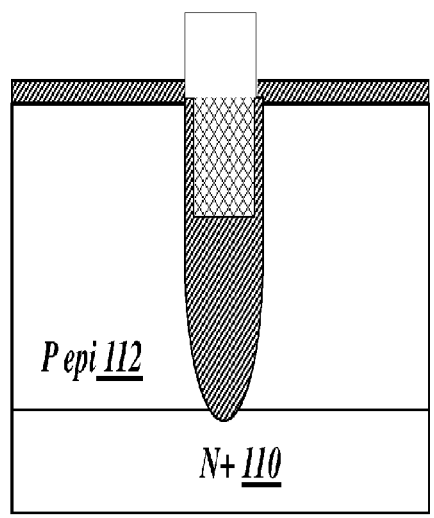
Figure 6H:
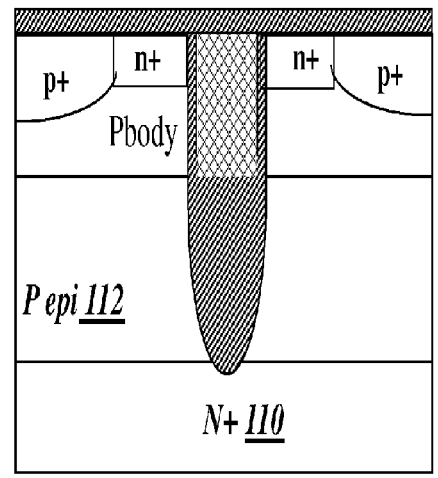

FIGS. 3(a)-3(c) collectively show an example of a lateral device in which the teachings illustrated in FIGS. 7-13 can also be implemented. In this example, an n-type source region 350 is contacted by source metallization 303. A stepped gate 330 overlies a p-type body region (not shown here). When gate 330 is driven sufficiently positive, a surface portion of the p-type body region will be inverted, to allow electrons to flow therethrough into a drift region 312, and thence into a drain diffusion 310. Drain diffusion 310 is contacted by drain metallization 302. Shallow trenches 320 parallel the direction of majority carrier flow, and contain spatially fixed net electrostatic charge 322 (which can be provided, for example, by cesium ions in silicon dioxide, or otherwise as described below).

FIG. 3(b) shows a section of the device of FIG. 3(a) along line A-A. Additional features visible in this drawing are the P+ body contact diffusion, an n+ drain contact diffusion, the gate oxide (or other thin dielectric), and a thicker dielectric which overlies the drift region 312. The substrate 390 is preferably a p+ semiconductor body, contacted by a backside metallization 392, but alternatively other substrate materials can be used. FIG. 3(c) similarly shows a section of the device of FIG. 3(a) along line B-B. Note that the body region 315 preferably has a higher level of acceptor doping than the drift region 312.

Figure 7:
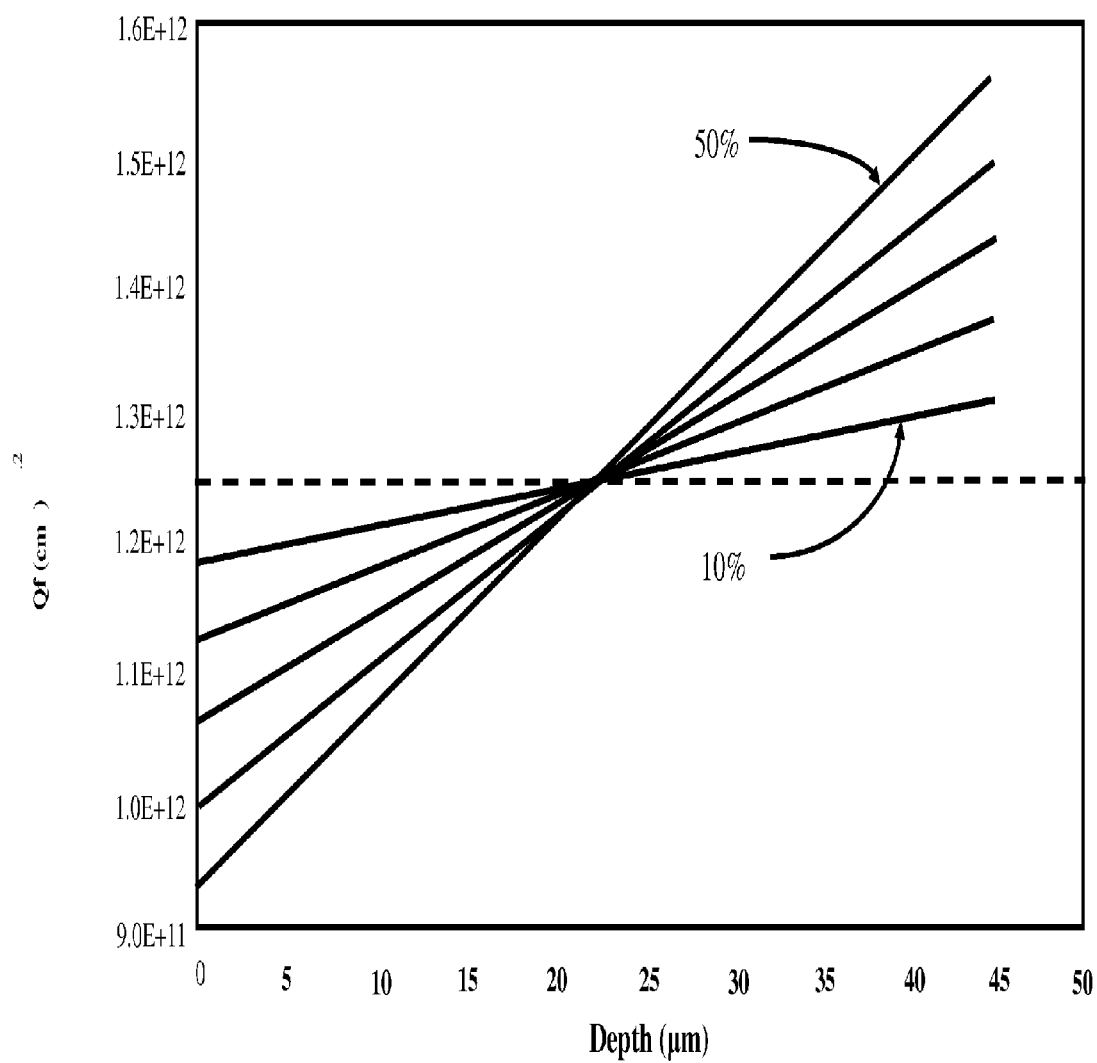
FIG. 7 shows several examples of how the permanent charge can be varied within the device structure of FIG. 1 in order to achieve both high breakdown voltage and high manufacturability.

FIG. 7 shows several examples of how the permanent charge can be varied within the device structure of FIG. 1 in order to achieve both high breakdown voltage and high manufacturability. FIG. 7 shows linear grading factors ranging from 0 to 50% with the lowest fixed charge being near the surface of the device while the highest fixed charge is near the n+ substrate. In this example, the trench depth is 45 microns, and the grading factor is stated as the total percentage variation with respect to the value at half the trench depth. Thus, for example, the 40% line shows a gradation from 20% less than the central value to 20% more. Of course, the trench depth can be more or less than this and non-linear permanent charge grading can be utilized.

Such permanent charge ($Q_F$) profiles can be obtained using a single or multiple implants of species such as Cesium, etc. with different doses and energies and with the same implant angle, $\phi$ or different angles (for example $\phi 1$, $\phi 2$, $\phi 3$, ... etc). Implants which are farther from vertical (i.e. with the wafer at a greater tilt angle) will provide a higher fraction of their dose into the upper trench rather than the lower trench. This may overcome some of the limitations of a single shallow implant angle.

Based on the geometry of the trench, the number of implants, their angle, and their dose need to be tailored to achieve the desired permanent charge profile. Therefore, multiple or single implant can be used where the implants' angles are adjusted such that the distribution of permanent charge ($Q_F$) from the top of the trench to the bottom will vary to produce the desired target breakdown voltage and largest charge imbalance window. Similarly, for lateral devices such as shown in FIGS. 3(a)-(c) the distribution of permanent charge ($Q_F$) vertically from the top of the trench to the bottom and laterally from source side towards drain side will vary to produce the desired target breakdown voltage and largest charge imbalance window.

Note that the areas under each of the curves shown in FIG. 6 are identical, but they simply vary in the charge distribution. Thus the average concentration of the fixed charge is identical for all distributions regardless of the grading factors used.

FIGS. 6(a)-6(h) show one example of a fabrication process used to build a device structure like shown in FIG. 1, which can optionally include the innovative features described in reference to FIG. 7 and the following Figures. Starting with P-epi material 114 on top of a N+ substrate, a hard mask such as silicon dioxide is deposited or grown. A trench is then etched followed by pad oxide growth. One or more angle implants of ions which will provide spatially fixed net electrostatic charge are then performed, preferably at multiple different tilt angles $\phi_1$, $\phi_2$, $\phi_3$, etc. The trench is then partially or completely filled with dielectric material 120 and the gate, source and body are formed.

Figure 8:
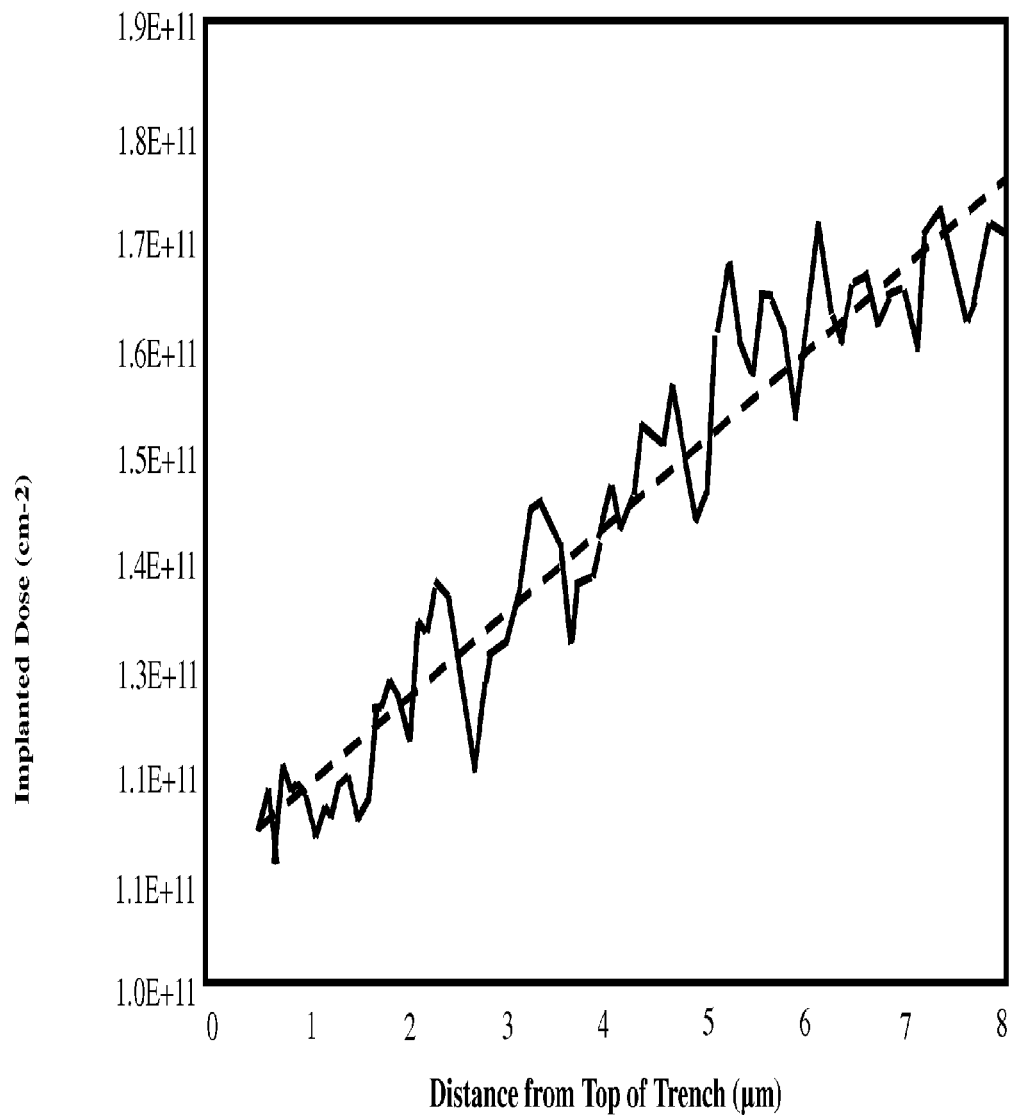
FIG. 8 shows a simulation of implant dose with depth, for an angle implant as shown in FIG. 7.

Monte Carlo simulations using two dimensional process simulators can be used to estimate the variation of ions implanted in such a manner as shown in FIG. 8. The actual dopant variation (which is noisy as a consequence of the nature of Monte Carlo simulation) can be modeled using a simple linear profile as shown. As mentioned earlier, the exact profile needed for a given trench geometry may require multiple implants so this simple case is provided as just an example. Monte Carlo simulations can be used to design the exact implant sequence needed.

Figure 9:
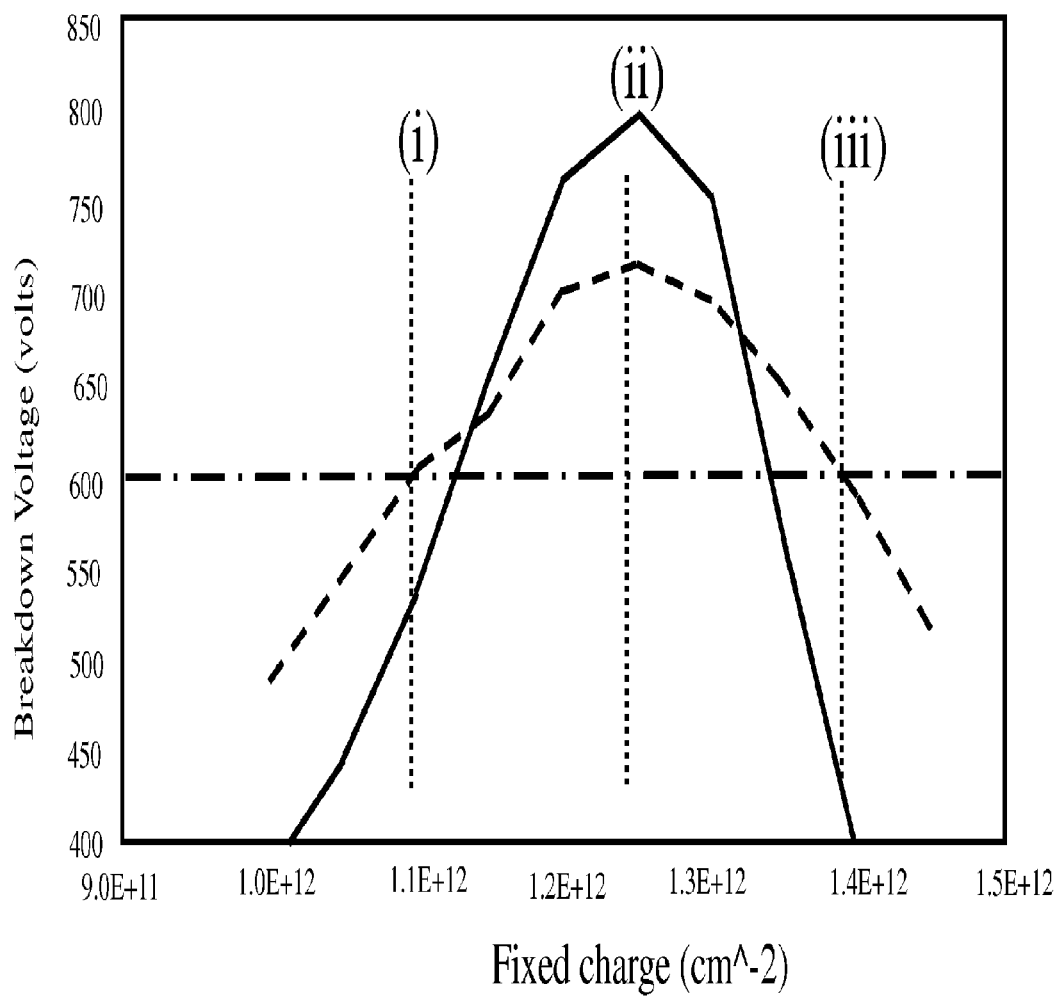
FIG. 9 shows two dimensional device simulation results for the case where there is grading of the permanent charge as shown in FIG. 7.

FIG. 9 shows two dimensional device simulation results for the case where there is 40% grading of the permanent charge as shown in FIG. 7. The curves for 10% and 50% grading are expressly labeled as such in FIG. 7, and the lines between them show 20%, 30%, and 40% grading. Although the peak breakdown voltage is reduced from almost 800V to 720V with 40% grading, note that the width of the breakdown curve is increased significantly at the target voltage rating of 600V. This is achieved without increasing the same cell pitch or degrading the specific on-resistance.

This is a surprising teaching, because the improved device (with higher breakdown voltage) is LESS robust than the optimized device. This is opposite to the usual direction of "improvement" in power devices. However, the present application teaches that it is more important to have a good tolerance to process variation, for a given voltage specification, than to maximize increase the breakdown voltage of a theoretically ideal device, assuming no process variation.

FIG. 9 shows three dotted vertical lines where the behavior of the two device examples can be seen to be significantly different—e.g. at $Q_F$=1.1E12, 1.25E12, and 1.4E12 cm$^{-2}$. Note that, for a total implanted dose (of Cs+ in this example) of 1.25 E12 cm$^{-2}$, the device with the graded fixed charge density has a LOWER breakdown voltage than the corresponding device with a uniform fixed charge density. Thus if the process is perfectly on target, the breakdown voltage will be REDUCED by the innovative teachings. However, at the upper and lower dosages $Q_F$=1.1 and 1.4E12 cm$^{-2}$, the breakdown voltage of the device with graded QF is significantly higher. Looking at the horizontal axis, it can be seen that the device with graded $Q_F$ stays at spec (BV>600V in this example) over about a 30% wider range of implant dosages.

Figure 10A:
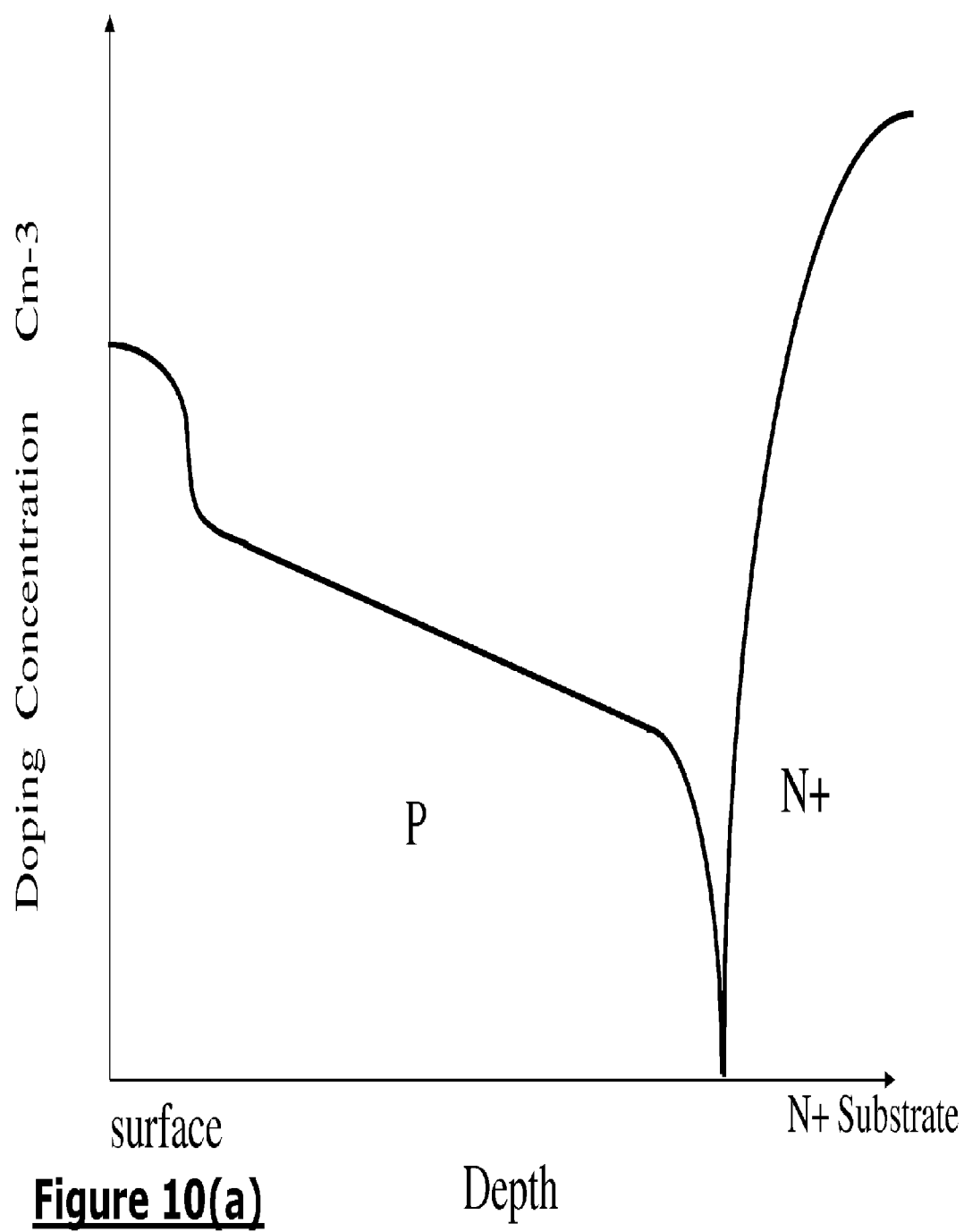
FIGS. 10(a) and 10(c) show examples of grading the epi layer doping concentration with higher doping towards the surface and lower doping at the substrate.

Another way to achieve a large process window without increasing the cell pitch is to tailor doping of the epitaxial p-type layer. FIG. 10(a) shows an example of grading the epi layer doping concentration with higher doping towards the surface and lower doping at the substrate. A "bump" in the doping profile is visible at the shallowest depths, where the dopant contribution of the p-type body is seen. Below the location of the body doping, the doping at the top of the device structure varies in a linear manner until the n+ substrate region is reached.

Figure 11:
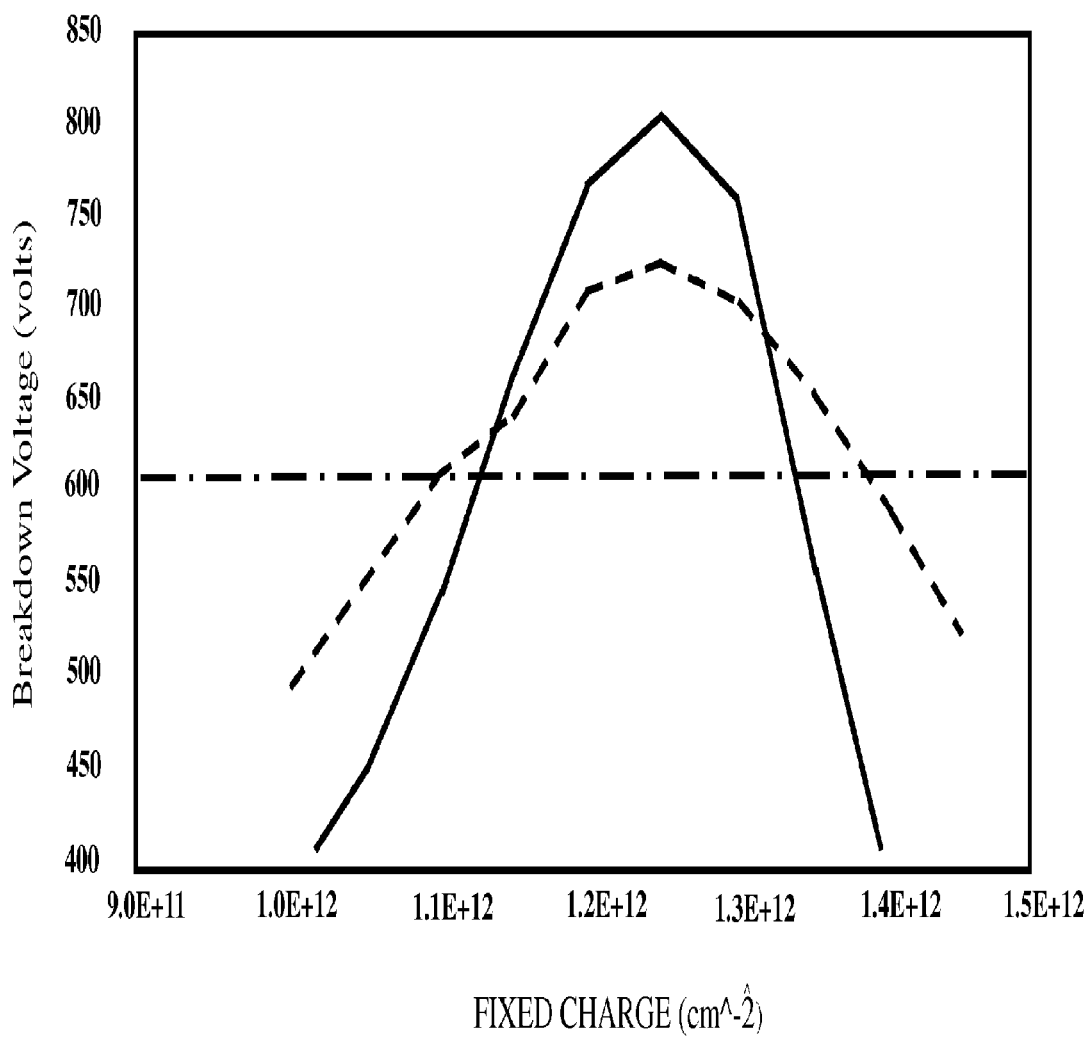
FIG. 11 shows two dimensional device simulation results for the case where the epi is linearly graded, as in FIG. 10(a).

FIG. 11 shows two dimensional device simulation results for the case where the epi is linearly graded, as in FIG. 10(a). In order to achieve the widest process window, the epi doping concentration at the top of the trench (or surface of the epi layer) is higher than at the bottom of the trench towards the n+ substrate. This type of grading gives similar effect as having the permanent charge graded as shown in FIG. 7. The results are very similar to those seen in FIG. 9 with the peak breakdown voltage reduced but with the manufacturing window increased.

In FIG. 11, as in FIG. 9, again, the three dotted vertical lines show three values of $Q_F$ where the behavior of the two device examples can be seen to be significantly different—e.g. at $Q_F$=1.1E12, 1.25E12, and 1.4E12 cm$^{-2}$. Note that, for a total implanted dose (of Cs+ in this example) of 1.25E12 cm$^{-2}$, the device with the graded Epi doping density has a LOWER breakdown voltage than the corresponding device with a uniform Epi doping density. Thus if the process is perfectly on target, the breakdown voltage will be REDUCED by the innovative teachings. However, at the upper and lower dosages $Q_F$=1.1E12 and 1.4E12 cm$^{-2}$, the breakdown voltage of the device with graded Epi is significantly higher. Looking at the horizontal axis, it can be seen that the device with graded $Q_F$ stays at spec (BV>600V) over about a 30% wider range of implant dosages.

Note that the slopes of the plots in FIGS. 7 and 10(a) are opposite: when the fixed charge is graded, it is lower at the surface; when the epitaxial doping is graded, it is higher at the surface. However, each of these cases implies that the ratio of fixed charge (atoms per unit area, e.g. cm$^{-2}$) to epitaxial doping (in atoms per unit volume, e.g. cm$^{-3}$) becomes high with increasing depth.

A different way to state this is in terms of the balance condition. For an array of infinite slot trenches, the charge balancing condition can be stated as $$Q_F = nd/2,$$

where $Q_F$ is the fixed charge in proximity to the drift region (e.g. near the sidewalls of the trenches),
d is the distance between adjacent trenches, and
n is the epitaxial doping (assumed to be uniform).

Since the grading of epi doping or of fixed charge produces a nonuniform ratio $Q_F/n$, we can describe both FIGS. 7 and 10(a) as having a gradation in charge balancing. Both of these Figures have a ratio $Q_F/n$ which is lower near the top of the trench, and higher near the bottom of the trench. When $Q_F$ is less than nd/2, we can describe the ratio as underbalanced. Thus this group of teachings can be described as having a more underbalanced ratio at the surface.

Another factor which affects charge balancing is the mesa width: if the trenches are tapered even slightly, then the mesa (the semiconductor material between adjacent trenches) will have a significantly different width at the top and bottom of the trench. For a trench which has a sidewall angle ψ and a depth of D, the trench width will be reduced by about D cos(ψ) microns over its depth. This can be significant: for example, if the trench sidewall angle ψ is 89°, the trench width will be reduced by more than 1.5 microns over the depth of a 45 micron trench. If the patterned trench width is 2 microns, and the cell pitch is 8 microns, then the mesa half-width will change by more than 25%. Since the mesa width d is not equal for every depth, this means that the ratio $Q_F/n$ will have to vary with depth. This in turn means that the gradation values of FIG. 7 may need to be adjusted. For example, if the mesa width is 20% greater at the trench bottom than at the trench top, the balance condition $Q_F/n=d/2$ implies that the balance value $Q_F/n$ is 20% higher at full depth D than at the surface. Therefore, in this case, if the charge density QF is graded according to (for example) the 50% curve of FIG. 7, some of this gradation will be offset by the gradation in the balance condition $Q_F/n=d/2$. Thus in this example, a 50% gradation, with a mesa having a 20% taper, would produce a net effect more like 25-35% gradation would if the trench had perfectly vertical sides.

FIGS. 12(a)-12(f) show plots of electric field versus depth for the three sample voltages (i), (ii) and (iii) marked in FIG. 9, both adjacent to the trenches and in the middle of the mesa. In each case two curves are given: the solid line curve shows results for uniform $Q_F$, and the dashed curve shows simulation results when $Q_F$ is graded by plus/minus 20%, as in the 40% curve shown in FIG. 7.

Figure 12A:
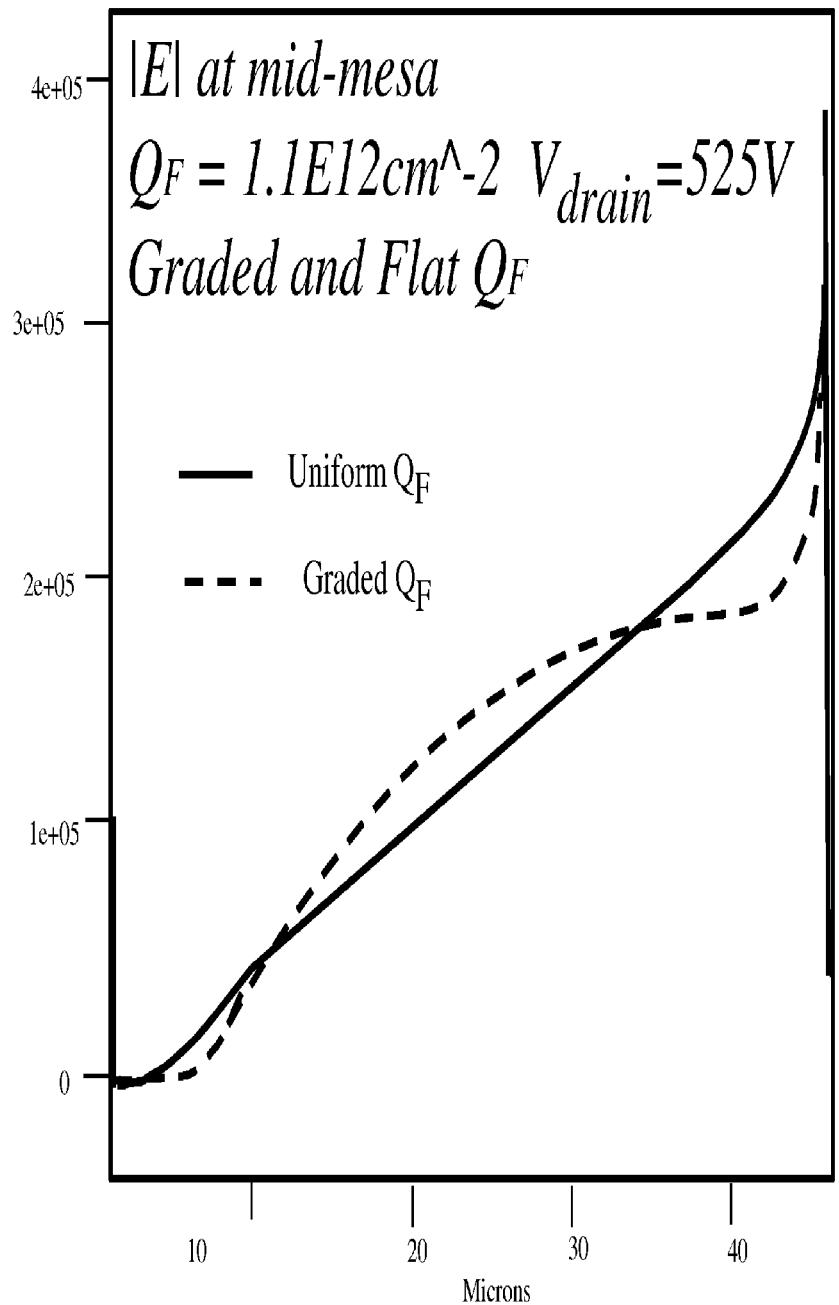
FIGS. 12(a)-12(f) show plots of electric field versus depth for the three sample fixed charge densities marked in FIG. 9, both adjacent to the trenches and in the middle of the mesa.

FIG. 12(a) shows the depth profile of electric field magnitude at the middle of the mesa, when the fixed charge per unit area $Q_F$ is assumed to be at the low end of the permissible range of process variation, i.e. at the leftmost line (i) in FIG. 9. (In this example, $Q_F$ is about 1.1E12 cm$^{-2}$.) The solid line curve shows the profile for a flat $Q_F$ structure just at the onset of breakdown, and the dashed curve shows the electric field profile for a device which is similar but has graded $Q_F$. Note that both curves have their maxima at the right side of the chart, i.e. at the deepest depth. Note also that, in this region, the dashed curve (with graded $Q_F$) is strictly less than the dotted curve. This shows that when the device with fixed $Q_F$ is already at the age of breakdown, the device with graded $Q_F$ does not have to withstand as high an electric field. Specifically, in this simulation the peak electric field for the flat $Q_F$ example is almost 4E5 V/cm at this voltage, whereas the peak electric field for the graded $Q_F$ example is about 10% less.

Figure 12B:
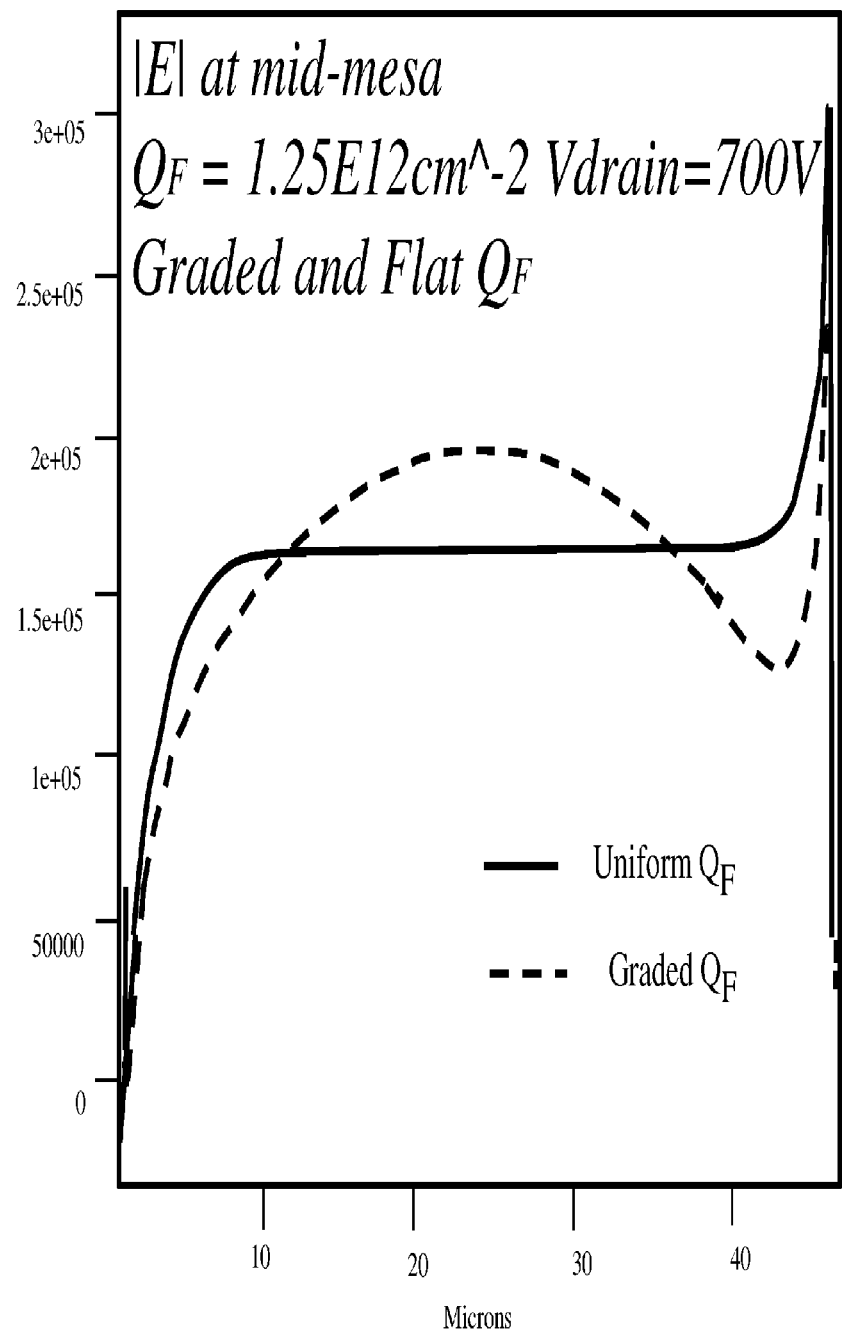

FIG. 12(b) shows the depth profile of electric field magnitude at the middle of the mesa, when the actual $Q_F$ areal density is on target (1.25E12 in this example), corresponding to the middle vertical line (ii) in FIG. 9. The peak electric field for the solid line curve shows a maximum value of only about 3E5 V/cm (at the full trench depth), and the dashed curve has an even lower maximum value. Note that here, as in FIG. 12(a), the dashed curve is higher than the dotted curve at about half the trench depth.

Figure 12C:
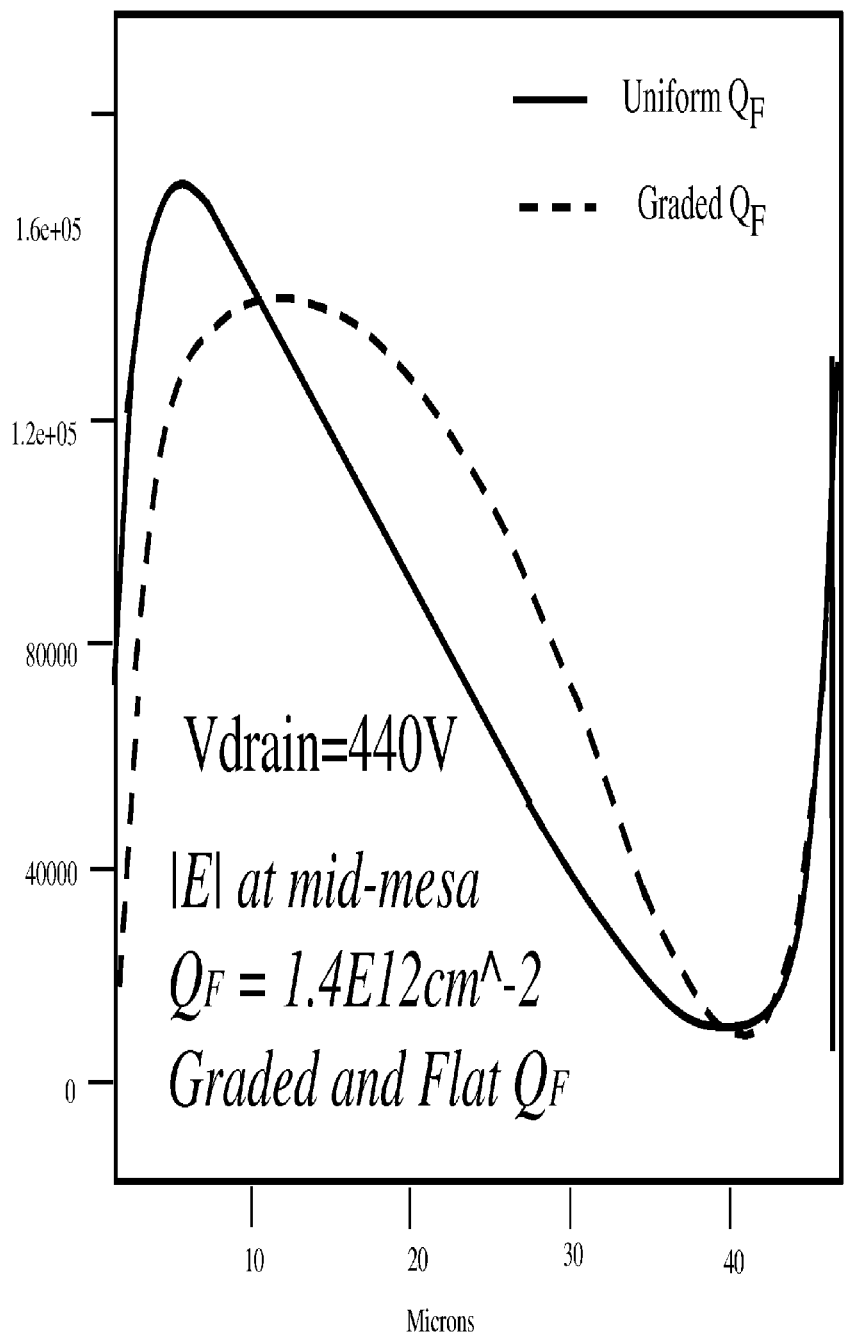

FIG. 12(c) shows the depth profile of electric field magnitude at the middle of the mesa, when the actual $Q_F$ areal density is at the high end of permissible variation (1.4E12 cm$^{-2}$ in this example). In this case the electric field for the solid line curve is higher than that for the dashed curve at most depths. However, in this case breakdown will be dominated by behavior at shallow depths near the silicon surface.

Figure 12D:
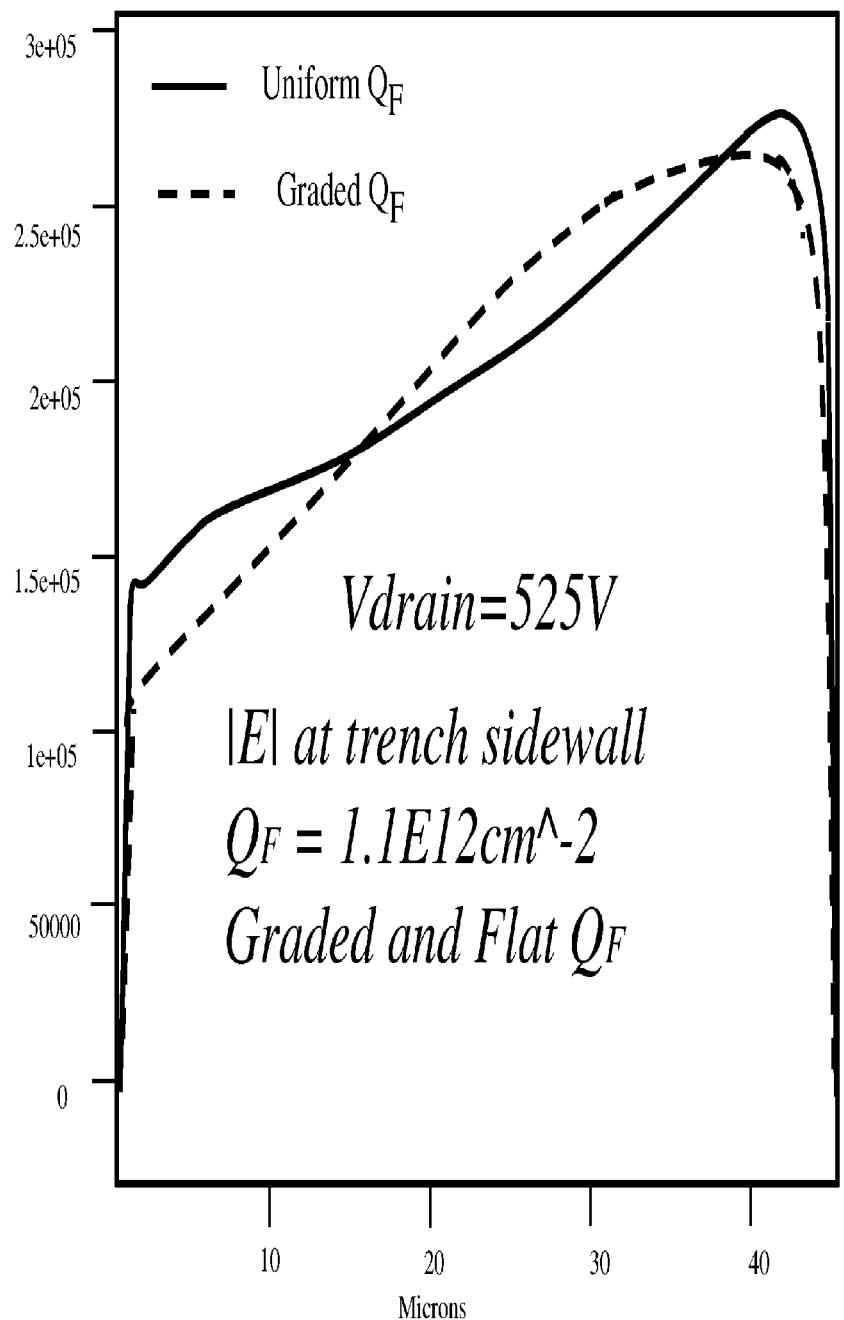

FIG. 12(d) similarly shows the depth profile of E-field magnitude near the trench, for the same case as FIG. 12(a). Note that the peak E-field is less than 3E5 for both solid and dashed curves, so breakdown is dominated by the high value shown at maximum depth in FIG. 12(a).

Figure 12E:
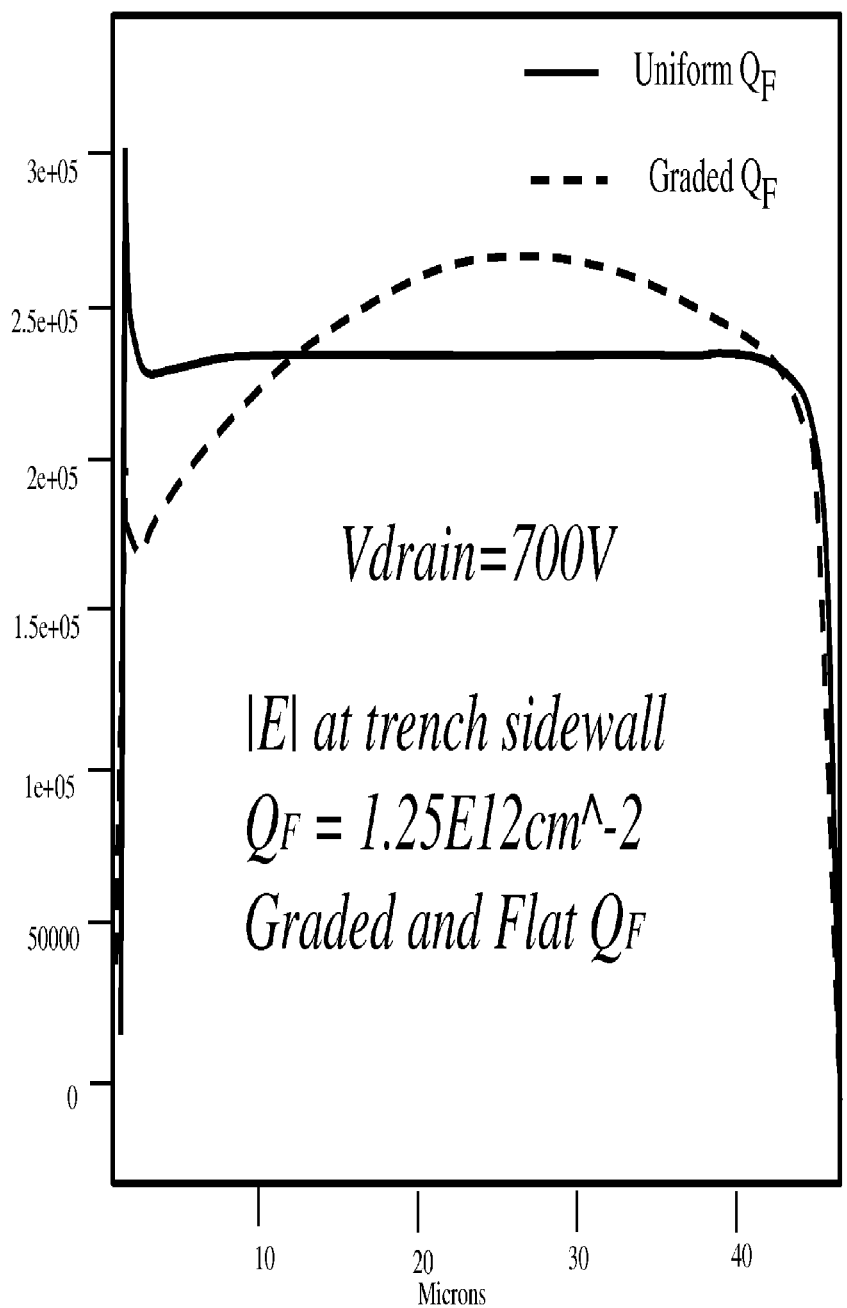

FIG. 12(e) similarly shows the depth profile of E-field magnitude near the trench, for the same case as FIG. 12(b). Note that the peak E-field, for the solid curve, is maximal near the surface, at about the same value (3.1E5) as in FIG. 12(b).

Figure 12F:
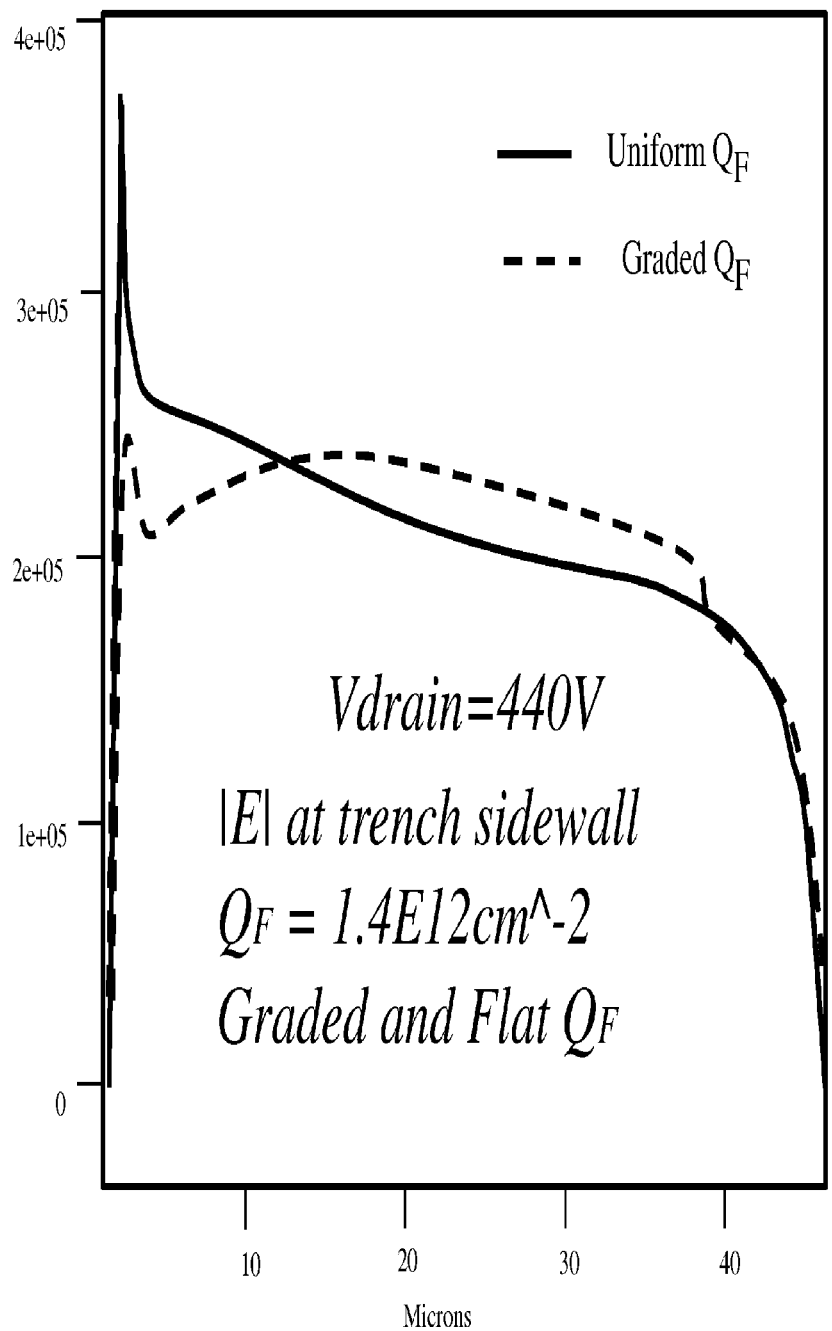

FIG. 12(f) similarly shows the depth profile of E-field magnitude near the trench, for the same case as FIG. 12(c). Here it can be seen that breakdown will occur first near the surface. This shows that when the device with uniform $Q_F$ is already at the age of breakdown, the device with graded $Q_F$ does not have to withstand as high an electric field. Specifically, in this simulation the peak electric field for the flat $Q_F$ example is almost 4E5 V/cm at this voltage, whereas the peak electric field for the graded $Q_F$ example is reduced by about 15%.

Figure 10B:
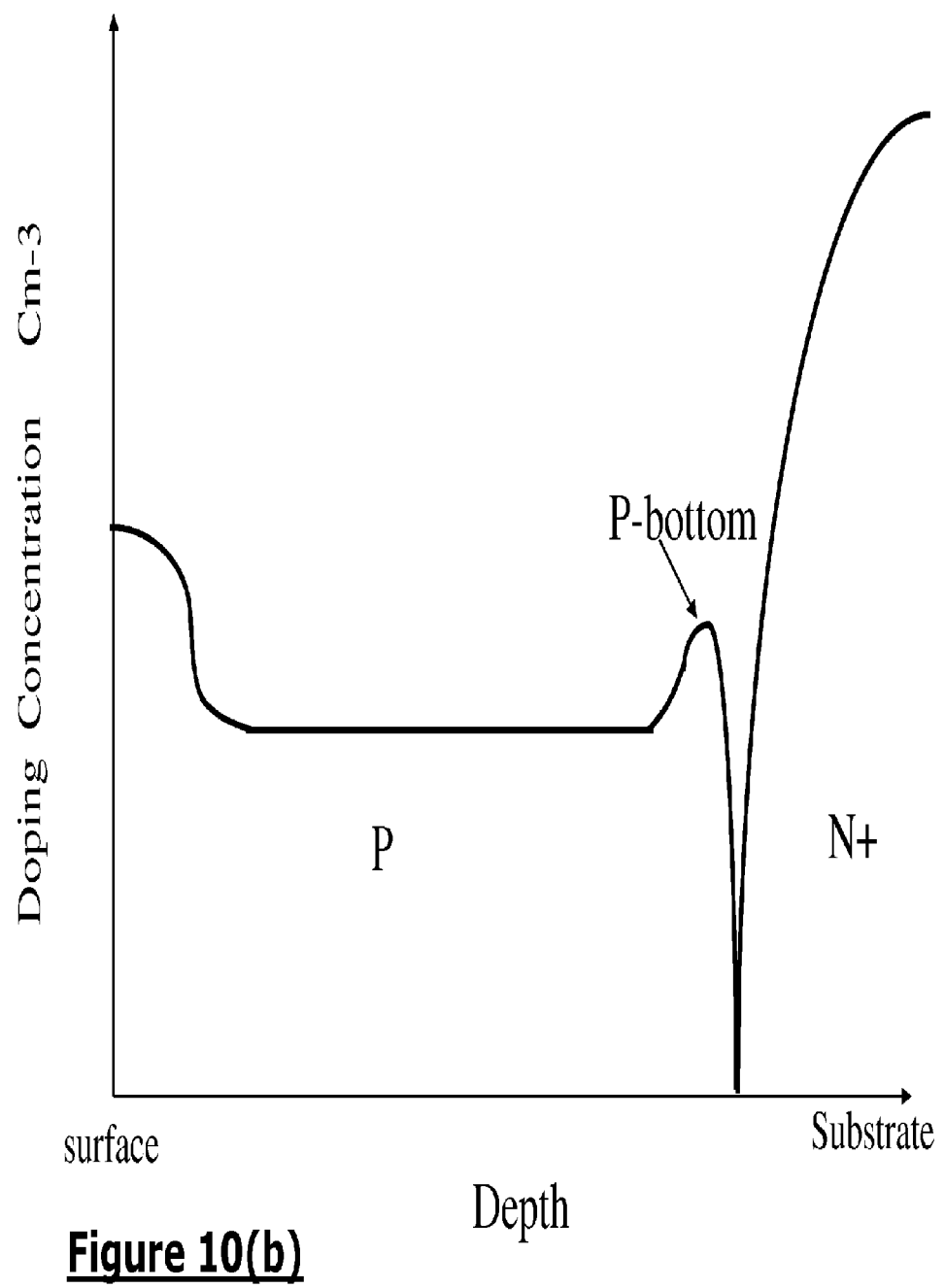

FIG. 10(b) shows another example of how the epi layer doping concentration can be modified. Here too, as in FIG. 10(a), a "bump" in the doping profile is visible at the shallowest depths, where the dopant contribution of the p-type body is seen. Below the location of the body doping, the doping at the top of the device structure is flat for most of the thickness. However, an additional concentration of acceptor dopants is present at the bottom of the epitaxial region, near the junction with the n+ substrate region.

Most power device structures do not have a pn junction between the epitaxial layer and the substrate. However, the p-on-n+ devices described above do have a junction here, and the inventors have realized a surprising implication of this: by increasing the doping on the p side of this junction (making the junction "sharper"), breakdown, if it occurs under reverse bias, is most likely to occur at this junction. This (surprisingly) is advantageous.

Figure 13:
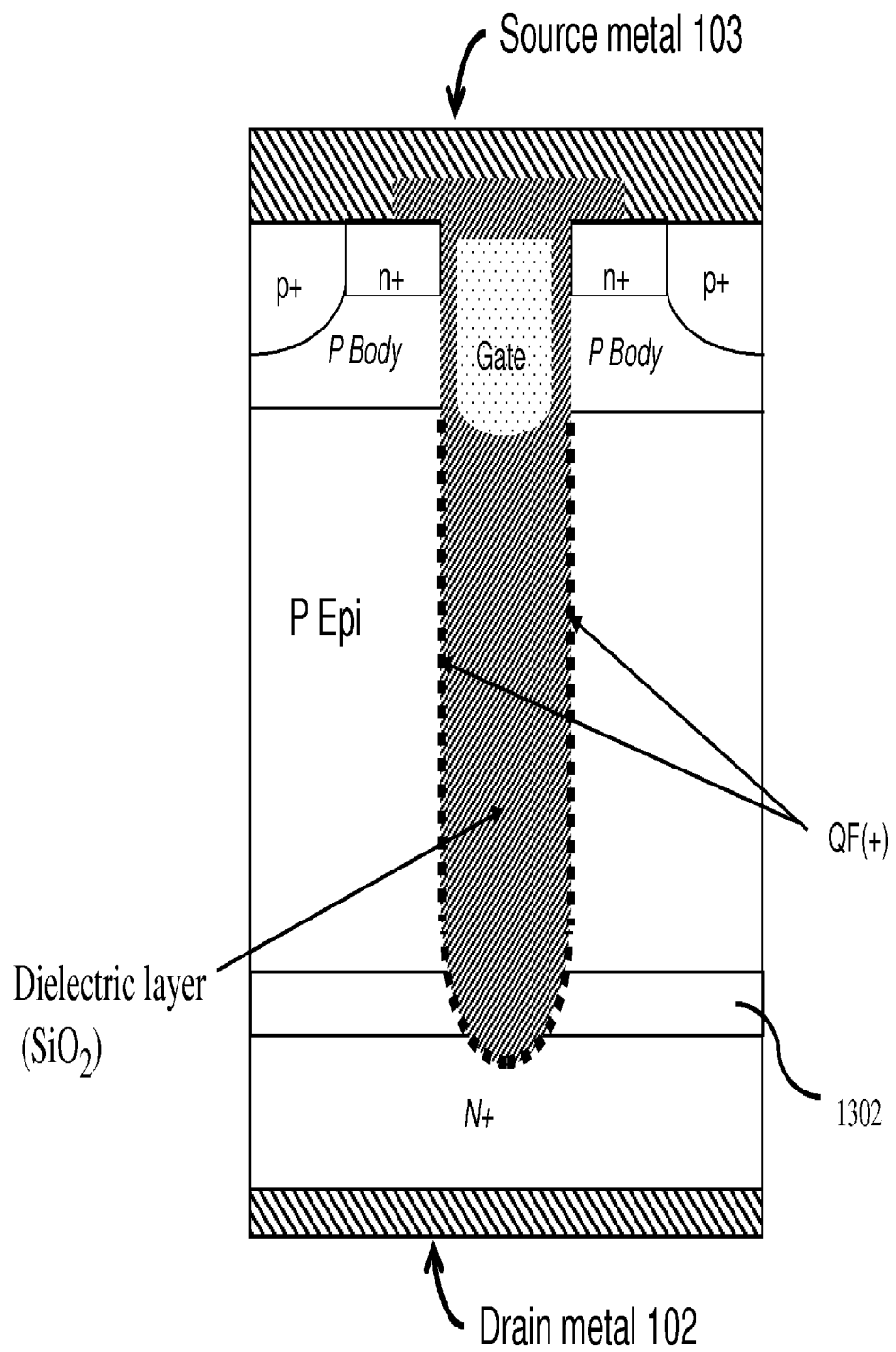
FIG. 13 shows a further modification of the device of FIG. 1, in which the additional deep p doping of FIG. 10(c) is schematically indicated in the device structure.

FIG. 13 shows a further modification of the device of FIG. 1, in which the additional deep p doping of FIG. 10(b) is schematically indicated in the device structure, in region 1302. This additional doping actually lowers the breakdown voltage of the pn junction somewhat, but has the advantage that the location of breakdown—if it occurs—is known. Breakdown near the epi-substrate junction is far distant from gate oxides, so hot carriers are less likely to cause cumulative shift in device parameters. Moreover, since this deep junction is also far removed from the source junction, regeneration is less likely.

Figure 10C:
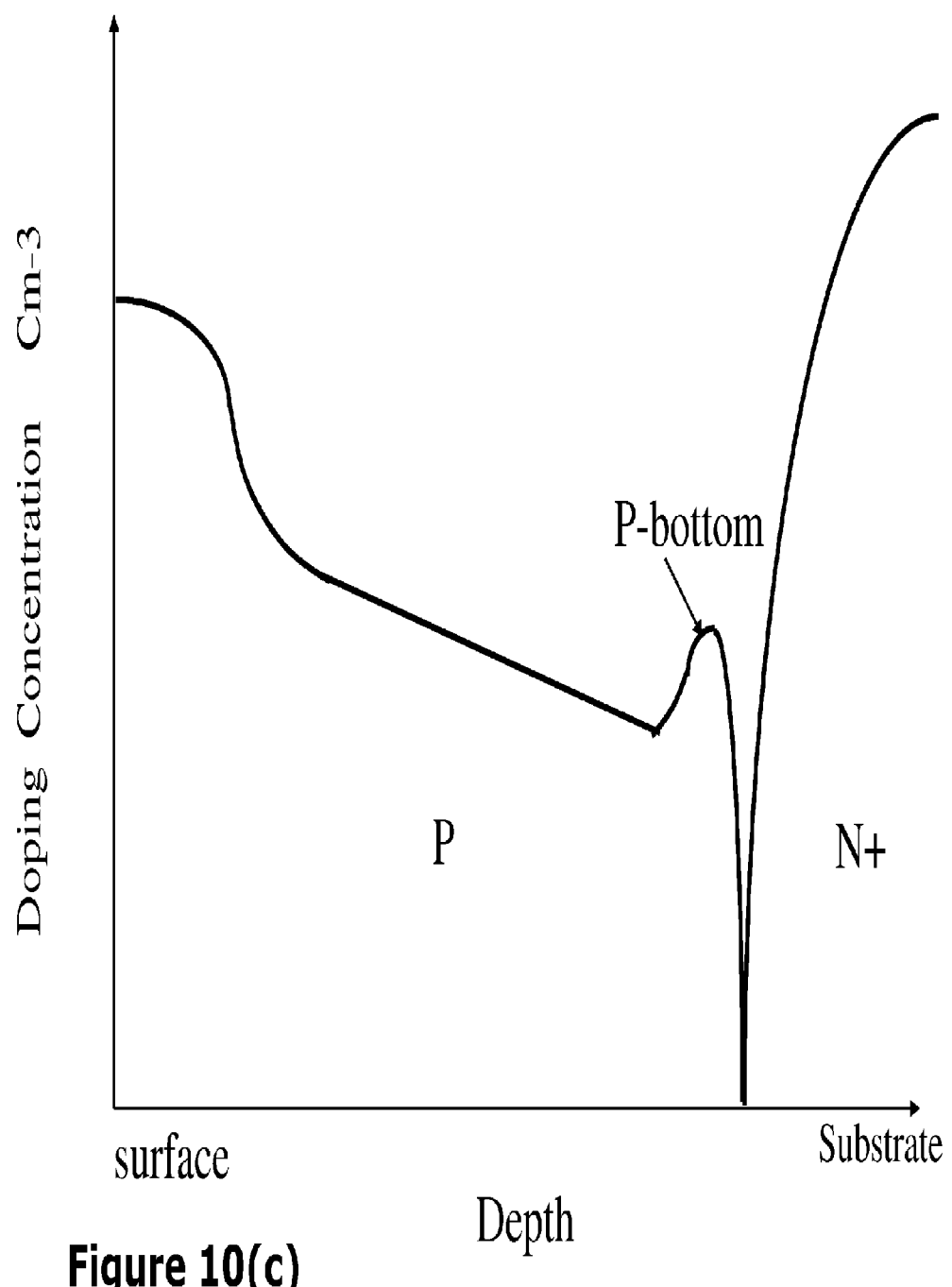

FIG. 10(c) shows how the additional deep p doping of FIG. 10(b) can be advantageously used in combination with graded epitaxial doping.

The profiles of FIGS. 10(b) and 10(c) can optionally be combined with graded fixed charge $Q_F$, and/or with tapered trenches. In this way there can be three different variables in the balance condition Thus the innovation shown in FIG. 13, like those of FIGS. 7 and 10(a), provides a device which can more consistently meet specifications despite process variation, while actually reducing the breakdown voltage achieved when process specifications are met precisely. This too is counterintuitive.

According to some but not necessarily all embodiments, there is provided: A power semiconductor device, comprising: a current-controlling structure, which under at least some conditions injects charge carriers into a semiconductor drift region; and at least one trench, extending downwardly in proximity to said drift region, which has dielectric material therein, and also includes spatially fixed net electrostatic charge; wherein said spatially fixed net electrostatic charge, and a dopant concentration of said drift region, have respective densities which both vary vertically along the length of said trench; and wherein the ratio of said spatially fixed net electrostatic charge to said dopant concentration is higher at lower portions of said trench than at upper portions of said trench.

According to some but not necessarily all embodiments, there is provided: A semiconductor device, comprising: a current-controlling structure, which under at least some conditions injects carriers into a semiconductor drift region; and at least one trench in proximity to said drift region, which includes spatially fixed net electrostatic charge, and which has a length extending along trajectories of said carriers; wherein said spatially fixed net electrostatic charge, or a dopant concentration of said drift region, or both have a density which varies along the length of said trench; and wherein said spatially fixed net electrostatic charge and said dopant concentration are jointly optimized NOT to achieve the highest possible breakdown voltage, for a given density of said net charge, but instead to achieve a specified breakdown voltage over a wider range of process variation than would otherwise be possible.

According to some but not necessarily all embodiments, there is provided: A power semiconductor device, comprising: a current-controlling structure, which under at least some conditions injects carriers from a first-conductivity-type source region into a second-conductivity-type semiconductor drift region; wherein said drift region is part of a semiconductor epitaxial layer, which overlies a first-conductivity-type semiconductor substrate to form a metallurgical junction therebetween; and at least one trench, extending downwardly into said drift region, which has dielectric material therein, and also includes spatially fixed net electrostatic charge in the dielectric material; wherein said drift region has a higher concentration of second-conductivity-type dopants at locations nearer said metallurgical junction than at some locations which are farther from said metallurgical junction.

According to some but not necessarily all embodiments, there is provided: A power semiconductor device, comprising: a first-conductivity-type semiconductor substrate, and at least one second-conductivity-type epitaxial layer overlying and forming a junction with said substrate; a semiconductor drift region, in said epitaxial layer, which extends down to said junction, and which has a dopant concentration which generally decreases with depth, EXCEPT that an additional concentration of second-conductivity type dopants is present in said drift region at said junction; a semiconductor source region, which has said first conductivity type, and a semiconductor body region which has said second conductivity type and which separates said source region from said drift region; and at least one gate electrode which controls accumulation or depletion a portion of said body region to thereby define a channel region therein; wherein, under at least some conditions, majority carriers pass from said source, through said channel and through said drift region to said substrate.

According to some but not necessarily all embodiments, there is provided: A power semiconductor device, comprising: a first-conductivity-type semiconductor substrate, and at least one second-conductivity-type epitaxial layer overlying and forming a junction with said substrate; at least one trench, extending downwardly into said epitaxial layer, which has dielectric material therein, and also includes spatially fixed net electrostatic charge; a semiconductor drift region, in said epitaxial layer, which extends down to said junction, and which has a dopant concentration which generally decreases with depth, EXCEPT that an additional concentration of second-conductivity type dopants is present in said drift region at said junction; a semiconductor source region, which has said first conductivity type, and a semiconductor body region which has said second conductivity type and which separates said source region from said drift region; and at least one gate electrode which controls accumulation or depletion a portion of said body region to thereby define a channel region therein; wherein, under at least some conditions, majority carriers pass from said source, through said channel and through said drift region to said substrate.

According to some but not necessarily all embodiments, there is provided: A method for forming a power semiconductor device, comprising: forming, on a semiconductor structure which includes a semiconductor deep layer of a first conductivity type overlain by a semiconductor drift region of a second conductivity type, at least one trench, extending downwardly into said drift region; implanting ions, of a species which provides spatially fixed net electrostatic charge, to thereby deposit, into said trench; wherein said implanting step is performed at multiple different tilt angles from normal, to thereby form a population of spatially fixed net electrostatic charge which varies vertically along the depth of said trench; and forming a current-controlling structure which at least partially controls conduction in said semiconductor structure near said trench.

According to some but not necessarily all embodiments, there is provided: A method for forming a power semiconductor device, comprising: forming, on a semiconductor structure which includes a semiconductor deep layer of a first conductivity type overlain by a semiconductor drift region of a second conductivity type, at least one trench, extending downwardly into said drift region; forming a thin dielectric layer on sidewalls of said trench; implanting ions, of a species which provides spatially fixed net electrostatic charge in said dielectric layer, to thereby deposit, into said trench; wherein said implanting step is performed at multiple different tilt angles from normal, to thereby form a population of spatially fixed net electrostatic charge which varies vertically along the depth of said trench; and forming a current-controlling structure which at least partially controls conduction in said semiconductor structure near said trench.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For one example, the disclosed teachings can also be implemented in lateral semiconductor device. In this case the density of fixed charge $Q_F$ is preferably graded laterally. This can be done, for example, by implanting through a tapered layer, or by using a process which includes some lateral erosion of photoresist or other patterned layer.

The above descriptions of charge balance assume that the background doping of the semiconductor material is constant at a given depth, but this too is another device parameter which can be adjusted.

For example, the disclosed inventions can also be applied to processes where doping is laterally outdiffused from trenches.

In other embodiments different combinations of epi doping and permanent charge variations can be used to obtain the largest manufacturing window for a given breakdown voltage rating.

The gradation of the permanent charge and/or P epi doping can also be non-linear, in order to optimize the device performance and increase the manufacturability charge imbalance or process window.

Furthermore, in other embodiments the P epitaxial region can be replaced by an implanted or diffused P-well region.

For another example, the epitaxial structure is preferably homoepitaxial, but heteroepitaxial structures can also be used in some embodiments.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way.

While only n-channel MOSFETs are shown here, p-channel MOSFETs are realizable with this invention simply by changing the polarity of the permanent charge and swapping n-type and p-type regions in any of the figures. This is well known by those of ordinary skill in the art.

It should be noted in the above drawings the positive permanent charge was drawn inside the dielectric for illustration purpose only. It is understood that the charge can be in the dielectric (oxide), at the interface between the silicon and oxide, inside the silicon layer or a combination of all these cases. Moreover, in some cases, even where the permanent charge is mostly located in the dielectric, some of the permanent charge may overlap into the semiconductor material.

It should also be understood that the dielectric which contains the permanent charge does not have to be pure grown $SiO_2$ (as in the preferred embodiment), but can be a slightly different material (e.g. off-stoichiometric or nitridized), or a more complexly layered dielectric structure, or even completely different material system.

For another example, it is also possible that other techniques can be used to adjust the vertical profile of the permanent charge, in embodiments which use a nonuniform profile. One possible example of this is use of a deposition step which is not uniform over the trench depth. (many processes are nonuniform when deep trenches are involved). In one contemplated example of this, if a thin layer of polysilicon or other sacrificial material is deposited after the thin trench oxide is grown, and then removed after the permanent charge is implanted, this sacrificial layer will have screened the upper trench sidewalls from some of the implanted permanent charge. This can result, desirably, in a density of permanent charge which increases toward the bottom of the trench.

Another contemplated technique to adjust the vertical profile of the permanent charge, in embodiments which use a nonuniform profile, is to use a dielectric etch step which is not uniform over the trench depth. (Many processes are nonuniform when deep trenches are involved). In one contemplated example of this, after a thin oxide is grown on the trench sidewalls and a permanent charge species is implanted, a very short nonuniform oxide etchback is performed, to remove the ion-loaded dielectric preferentially from upper parts of the trench sidewalls. This can result, desirably, in a density of permanent charge which increases toward the bottom of the trench.

Another contemplated technique to adjust the vertical profile of the permanent charge, in embodiments which use a nonuniform profile, is to use a complementary deposition of permanent charge into at a larger off-axis angle, to compensate some of the permanent charge in the upper parts of the trench. For example, in the $Si/SiO_2$ example, a near-normal implant of Cs+ can be following by a lighter dose of iodine (I-ions) at an angle which is farther from normal. This can result, desirably, in a density of net permanent charge which increases toward the bottom of the trench. In this case it is particularly preferable that the implanted oxide be stripped and regrown before the gate electrode is formed.

Another contemplated technique is to use a physical etch to transfer some of the ion-loaded dielectric from upper portions of the trench sidewalls to lower portions of the trench sidewalls. This can result, desirably, in a density of permanent charge which increases toward the bottom of the trench.

It is also understood that this invention is also valid if the opposite polarity of the permanent charge and the semiconductor conductivity types are used.

It is also understood that numerous combinations of the above embodiments can be realized.

Additional general background, which helps to show variations and implementations, as well as some features which can be synergistically with the inventions claimed below, may be found in the following US patent applications. All of these applications have common ownership, copendency, and at least some common inventorship with the present application, and all of them, and all their priority applications, are hereby incorporated by reference: WO/2008/039459, US20080073707; US20080191307; US20080164516; US20080164518; US20080164520; US20080166845, WO2009/102684; US20090206924; WO/2009/102651, US20090206913; US20090294892; and unpublished U.S. application Ser. Nos. 12/431,852; 12/394,107; 12/432,917; 12/431,005; 12/369,385; 12/545,808; 12/626,523; 12/626,589; 12/759,696; 61/181,751, 61/181,764, 61/225,009, 61/281,548, 61/225,021, 61/244,364, 61/258,159, 61/258,577, 61/260,320, 61/281,548, 61/293,741, 61/294,427, 61/298,894, 61/302,208, 61/307,007, 61/325,789, 61/326,210, 61/332,789, and 61/334,573. Applicant reserves the right to claim priority from these applications, directly or indirectly, and therethrough to even earlier applications, in all countries where such priority can be claimed.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way. Both cellular and interdigitated surface geometries are well known to one of ordinary skill in the art.

While only diodes and MOSFET transistors are shown here, the disclosed inventions can be adapted to many other unipolar device types such as JFETs, or to a wide variety of devices, such as IGBTs, which include bipolar conduction.

The preferred embodiments described above use monocrystalline silicon as the semiconductor material, but it is alternatively possible to use other semiconductor materials. One example is SiGeC, but other Group IV compound semiconductors are also possible, as well as other semiconductor materials.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A power semiconductor device, comprising:
   a first-conductivity-type semiconductor substrate, and at least one second-conductivity-type epitaxial layer overlying and forming a junction with said substrate;
   at least one trench, extending downwardly into said epitaxial layer, which has dielectric material therein, and also includes vertically graded spatially fixed net electrostatic charge which tends to deplete adjacent second-conductivity-type semiconductor material;
   a semiconductor drift region, in said epitaxial layer, which extends down to said junction, and which has a dopant concentration which generally decreases with depth, EXCEPT that an additional concentration of said second-conductivity type dopants is present in said drift region at said junction;
   a semiconductor source region, which has said first conductivity type, and a semiconductor body region which has said second conductivity type and which separates said source region from said drift region; and
   at least one gate electrode which controls accumulation or depletion of a portion of said body region to thereby define a channel region therein;
   wherein, under at least some conditions, majority carriers pass from said source, through said channel and through said drift region to said substrate.

2. The device of claim 1, wherein said first conductivity type is n type.

3. The device of claim 1, wherein said spatially fixed net electrostatic charge comprises implanted ions embedded in a dielectric material.

4. The device of claim 1, wherein said substrate is monocrystalline silicon, and said spatially fixed net electrostatic charge comprises implanted ions embedded in silicon dioxide.

5. The device of claim 1, wherein said semiconductor drift region consists essentially of silicon.

6. The device of claim 1, wherein said spatially fixed net electrostatic charge is lower near the top of said trench than at intermediate depths of said trench.

7. The device of claim 1, wherein the dopant concentration of said drift region decreases with increasing depth.

8. The device of claim 1, wherein the dopant concentration of said drift region decreases with increasing depth, but also increases sharply at the lowest depth of said drain region, in proximity to a metallurgical junction.

* * * * *